(12) United States Patent
Henley et al.

(10) Patent No.: US 8,124,499 B2
(45) Date of Patent: Feb. 28, 2012

(54) METHOD AND STRUCTURE FOR THICK LAYER TRANSFER USING A LINEAR ACCELERATOR

(75) Inventors: Francois J. Henley, Aptos, CA (US);
Albert Lamm, Suisun City, CA (US);
Babak Adibi, Los Altos, CA (US)

(73) Assignee: Silicon Genesis Corporation, San Jose, CA (US)

( * ) Notice: Subject to any disclaimer, the term of this patent is extended or adjusted under 35 U.S.C. 154(b) by 0 days.

(21) Appl. No.: 11/935,197

(22) Filed: Nov. 5, 2007

(65) Prior Publication Data
US 2008/0206962 A1 Aug. 28, 2008

Related U.S. Application Data

(60) Provisional application No. 60/864,584, filed on Nov. 6, 2006, provisional application No. 60/886,827, filed on Jan. 26, 2007.

(51) Int. Cl.
*H01L 21/00* (2006.01)
*H01L 21/30* (2006.01)
*H01L 21/46* (2006.01)

(52) U.S. Cl. ........ 438/460; 438/458; 438/459; 438/463; 438/464

(58) Field of Classification Search .................. None
See application file for complete search history.

(56) References Cited

U.S. PATENT DOCUMENTS

| | | | |
|---|---|---|---|
| 2,921,836 A * | 1/1960 | McCord et al. .................. | 423/69 |
| 4,490,648 A | 12/1984 | Lancaster et al. | |
| 4,494,040 A | 1/1985 | Morretti | |
| 4,712,042 A | 12/1987 | Hamm | |
| 4,885,470 A | 12/1989 | Abbott | |
| 4,949,047 A | 8/1990 | Hayward et al. | |
| 5,179,350 A | 1/1993 | Bower et al. | |
| 5,198,371 A | 3/1993 | Li | |

(Continued)

FOREIGN PATENT DOCUMENTS

JP   11-45840 A   2/1999

(Continued)

OTHER PUBLICATIONS

Principles of Charged Particles Acceleration by S. Humphries, 1999, p. 438.*

(Continued)

*Primary Examiner* — N Drew Richards
*Assistant Examiner* — Michael Jung
(74) *Attorney, Agent, or Firm* — Kilpatrick Townsend & Stockton LLP

(57) ABSTRACT

Free standing thickness of materials are fabricated using one or more semiconductor substrates, e.g., single crystal silicon, polysilicon, silicon germanium, germanium, group III/IV materials, and others. A semiconductor substrate is provided having a surface region and a thickness. The surface region of the semiconductor substrate is subjected to a first plurality of high energy particles generated using a linear accelerator to form a region of a plurality of gettering sites within a cleave region, the cleave region being provided beneath the surface region to defined a thickness of material to be detached, the semiconductor substrate being maintained at a first temperature. The surface region of the semiconductor substrate is subjected to a second plurality of high energy particles generated using the linear accelerator, the second plurality of high energy particles being provided to increase a stress level of the cleave region from a first stress level to a second stress level.

25 Claims, 24 Drawing Sheets

U.S. PATENT DOCUMENTS

| | | | |
|---|---|---|---|
| 5,315,120 A | 5/1994 | Potter | |
| 5,382,914 A | 1/1995 | Hamm et al. | |
| 5,422,549 A | 6/1995 | Shepard et al. | |
| 5,440,203 A | 8/1995 | Nakanishi | |
| 5,633,174 A | 5/1997 | Li | |
| 5,714,395 A | 2/1998 | Bruel | |
| 5,825,140 A | 10/1998 | Fujisawa | |
| 5,877,070 A | 3/1999 | Goesele et al. | |
| 6,013,563 A * | 1/2000 | Henley et al. | 438/458 |
| 6,027,988 A | 2/2000 | Cheung et al. | |
| 6,083,324 A | 7/2000 | Henley et al. | |
| 6,146,979 A * | 11/2000 | Henley et al. | 438/458 |
| 6,184,111 B1 | 2/2001 | Henley et al. | |
| 6,190,998 B1 | 2/2001 | Bruel et al. | |
| 6,284,631 B1 | 9/2001 | Henley et al. | |
| 6,291,313 B1 | 9/2001 | Henley et al. | |
| 6,291,314 B1 | 9/2001 | Henley et al. | |
| 6,303,468 B1 | 10/2001 | Aspar et al. | |
| 6,320,334 B1 | 11/2001 | Roberge et al. | |
| 6,322,220 B1 | 11/2001 | Sano et al. | |
| 6,335,264 B1 * | 1/2002 | Henley et al. | 438/460 |
| 6,352,909 B1 | 3/2002 | Usenko | |
| 6,429,094 B1 | 8/2002 | Maleville et al. | |
| 6,429,104 B1 | 8/2002 | Auberton-Herve | |
| 6,437,313 B2 | 8/2002 | Yamazaki et al. | |
| 6,503,321 B2 * | 1/2003 | Levy et al. | 117/89 |
| 6,544,862 B1 | 4/2003 | Bryan | |
| 6,602,767 B2 | 8/2003 | Nishida et al. | |
| 6,744,225 B2 | 6/2004 | Okamura et al. | |
| 6,756,286 B1 | 6/2004 | Moriceau et al. | |
| 6,806,171 B1 | 10/2004 | Ulyashin et al. | |
| 6,809,044 B1 | 10/2004 | Aspar et al. | |
| 6,828,216 B2 | 12/2004 | Schwarzenback et al. | |
| 6,838,358 B2 | 1/2005 | Maurice et al. | |
| 6,855,619 B2 * | 2/2005 | Iwasaki et al. | 438/475 |
| 6,858,107 B2 * | 2/2005 | Ghyselen et al. | 156/250 |
| 6,890,838 B2 | 5/2005 | Henley et al. | |
| 6,933,507 B2 | 8/2005 | Purser et al. | |
| 7,148,124 B1 * | 12/2006 | Usenko | 438/458 |
| 7,312,125 B1 | 12/2007 | Xiang et al. | |
| 2002/0029849 A1 | 3/2002 | Ohmi et al. | |
| 2003/0124815 A1 | 7/2003 | Henley et al. | |
| 2004/0121559 A1 * | 6/2004 | Solanki | 438/460 |
| 2004/0171232 A1 * | 9/2004 | Cayrefourcq et al. | 438/458 |
| 2005/0070071 A1 * | 3/2005 | Henley et al. | 438/459 |
| 2005/0124138 A1 | 6/2005 | Aspar et al. | |
| 2005/0148163 A1 | 7/2005 | Nguyen et al. | |
| 2005/0186758 A1 * | 8/2005 | Henley et al. | 438/458 |
| 2005/0272225 A1 * | 12/2005 | Weber et al. | 438/460 |
| 2006/0060943 A1 | 3/2006 | Mohamed et al. | |
| 2006/0073674 A1 | 4/2006 | Fitzgerald et al. | |
| 2006/0166472 A1 | 7/2006 | Henley et al. | |
| 2006/0211219 A1 * | 9/2006 | Henley et al. | 438/458 |
| 2006/0249135 A1 * | 11/2006 | Matsumoto | 125/21 |
| 2007/0176123 A1 * | 8/2007 | Rubin et al. | 250/492.21 |
| 2007/0249140 A1 * | 10/2007 | Dross et al. | 438/458 |
| 2008/0286937 A1 * | 11/2008 | Mitani | 438/458 |

FOREIGN PATENT DOCUMENTS

| | | |
|---|---|---|
| SU | 3719121/31-25 | 12/1983 |
| WO | WO 01/11930 A | 2/2001 |
| WO | WO 01/45178 A1 | 6/2001 |

OTHER PUBLICATIONS

Brindos et al., in:Properties of Crystalline Silicon, edited by R. Hull, © 1999 Institute of Electrical Engineers, pp. 733-737.*
Fracture Mechanics of Brittle Materials: a Historic View, by L. Ceriolo et al., pp. 1-3, in: 2nd Int. Ph.D. Symposium in Civil engineering, 1998, Budapest.*
"Fracture Mechanics of Brittle Materials: a Historical Point of View" by L. Ceriolo and A. Di Tommaso in: 2nd Int. Ph.D. Symposium in Civil Engineering, 1998, Budapest.*
https://www.chiphistory.org/documents/ion-implantation.pdf, © VLSI Research Inc., 1991, chapter 4.5, §3, line 5.*
Present and Future Applications of Inductrial Accelerators by C.S. Nunan, Proceedings of the 9th Fermilab Induxtrial Affiliates Roundtable on Applications of Accelerators, 1989.*
Brindos et al. (in: "Properties of Crystalline Silicon" edited by R. Hull, © 1999 Institute of Electrical Engineers, pp. 733-755).*
https://www.chiphistory.org/documents/ion-implantation.pdf, © VLSI Research Inc., 1991; chapter 4.5, §1, line 8.*
"Chambers Dictionary of Science and Technology", © 1999 Chambers Harrap, p. 376.*
C.S. Nunan, Proceedings of the 9th Fermilab Industrial Affiliates Roundtable on Applications of Accelerators, 1989.*
"Properties of Crystalline Silicon" edited by R. Hull, © 1999 Institute of Electrical Engineers, pp. 733-737.*
Schempp et al. In "Properties of RFQ accelerators for ion implantation", 1992, Nuclear Instruments and Methods in Physics Research Section B: Beam Interactions with Materials and Atoms, vol. 68, Issues 1-4, Abstract.*
Assaf et al. in "Transfer of thin silicon layers by MeV hydrogen implantation", 2005, Nuclear Instruments and Methods in Physics Research B 240, pp. 183-187.*
Agarwal et al., Efficient Production of Silicon-On-Insulator films by co-implantation of He+ with H+, Applied Physics Letters, v.72, No. 9, Mar. 1998.
Aleksandrov et al., Behavior of Implanted Hydrogen in Thermally Stimulated Blistering in Silicon, Radiation Effects & Defects in Solids, Nov.-Dec. 2003, v.158, pp. 771-781.
Assaf et al., Transfer of Thin Silicon Layers by MeV Hydrogen Implantation, Elsevier, Nuclear Instruments and Methods in Physics Research B 240 (2005), pp. 183-187.
Australian Patent Office Search Report for SG Application No. 200800768-4, mailed on Jun. 3, 2008, 6 pages total.
Ballard et al., Development of a Thin Film Silicon Benchmark Cell, Experimental Solid State Physics, Imperial College, London, Exhibition Road, London, UK.
Bedell, Blistering and Layer Transfer of Hydrogen Implanted Crystals, A Dissertation submitted to the University at Albany, State University of NY, College of Arts and Sciences, Department of Physics, 2000.
Blakers, et al., Silicon Epitaxial Solar Cell with 663-mV Open-Circuit Voltage, Appl. Phs. Lett 60 (22), Jun. 1992.
Dominguez et al., Introduction of Thinner Monocrystalline Silicon Wafers in an Industrial Cell Manufacturing Facility, BP Solar Espana, Pol. Ind. Tres Cantos, S/N Zona Oeste, Madrid, Spain.
Düngen et al., Thermal Evolution of Hydrogen Related Defects in Hydrogen Implanted Czochralski silicon investigated by Raman Spectroscopy and Atomic Force Microscopy, Journal of Applied Physics 100, 034911, 2006.
Faller et al., Optimization of the DVD Process for Low-Cost Crystalline-Silicon thin-Film Solar Cells, 2nd World Conference and Exhibition on Photovoltaic Solar Energy Conversion, Jul. 1998, Vienna, Austria.
Frabboni et al., Transmission Electron Microscopy Study of Blisters in High-Temperature Annealed He and H co-implanted single-crystal silicon, Applied Physics Letters, v 85, No. 10, Sep. 2004.
Fu et al., Layer Transfer for SOI Structures Using Plasma Hydrogenation, Department of Physics and Materials Science, City University of Hong Kong, Kowloon, Hong Kong, 2006.
Gao et al., A Transmission Electron Microscopy Study of Microstructural Defects in Proton Implanted Silicon, J. Appl. Phs. 80 (8), Oct. 15, 1996.
Goetzberger, Optical Confinement in thin Si-Solar Cells by Diffuse Back Reflectors, Fraunhofer-Gesellschaft, Freiburg, W. Germany, 1981.
Green et al., Enhanced Light Trapping in 21.5% Efficient Thin Silicon Solar Cells, 13th European Photovoltaic Solar Energy Conference, Oct. 1995, France.
Gui et al, The Effect of Surface Roughness on Direct Wafer Bonding, Journal of Applied Physics, v 85, No. 10, May 1999.
Gui et al, Selective Wafer Bonding by Surface Roughness Control, Journal of Electrochemical Society, 148 (4) G225-G228, 2001.
Halahan et al, Adaptation of Backgrinding for Thin Wafer Production, Tru-Si technologies.
Hamm, The Missing Link Accelerator, The World & I, pp. 362-370, 1998.

Hebling et al., High-Efficiency (19.2%) Silicon-Thin-Film Solar Cells with Interdigitated Emitter and Base Front- Contacts, 14th European Photovoltaic Solar Energy Conference, Barcelona, Spain, Jun. 1997.

Henley, An Alternative to Front-Side H-Implant: Use of P111 and a drive-it anneal for bonded pair, backside H-doping, Silicon Genesis Corporation, Dec. 1999.

Hurley et al., Ion Implantation of Hydrogen and Helium into Silicon Wafers for Layer Transfer in Devices, Elsevier, Vacuum 78, 2005, pp. 167-175.

International Search Report corresponding to the PCT Application No. PCT/US07/84130, date of mailing Mar. 31, 2008, 1 page total.

International Search Report corresponding to the PCT Application No. PCT/US07/83784, date of mailing May 1, 2008, 1 page total.

Job et al., Mechanisms of Hydrogen Plasma Supported Layer Exfoliation in Silicon, University of Hagen, Hagen Germany.

Johnson et al., Hydrogen-Induced Platelets in Silicon: Separation of Nucleation and Growth, Materials Science Forum V. 83-87, 1999, pp. 33-38.

Joly, New Wafer to Wafer and Chip to Wafer Device Stacking Technology Implementations "3D Architectures for Semiconductor Integration and Packaging", Tempe AZ Jun. 13-15, 2005.

Kozlovski et al., Distribution of Hydrogen in Silicon and Silicon Carbide following high-temperature proton irradiation, Semiconductors, V. 33, No. 12, Dec. 1999.

Lafontaine et al., Wafer Temperature and Stress Profiles in an MeV Ion Planter Using the Finite-Element Method, Ion Technology Division, Massachusetts, 1997.

Morehead, et al., A Model for the Formation of amorphous Si by Ion bombardment, IBM Thomas J. Watson Research Center, Yorktown Heights, NY, Conference in Thousand Oaks, CA, May 1970.

Mukashev et al., Hydrogen Implantation into Silicon: Infra-Red Absorption Spectra and Electrical Properties, Institute of High Energy Physics, Academy of Sciences of the Kazakh SSR, Alma-Ata; phys. stat. sol. (a) 91, 509 (1985).

Ottaviani et al., Study of Blisters in He, H co-implanted single crystal silicon, 1 Physics Department, University of Modena and Reggio Emilio Via Campi, Italy.

Parry et al., Target heating during ion Implantation, J. Vac. Sci. Technol. V. 13, No. 2, Mar./Apr. 1976.

Radovanov et al., Wafer Cooling for a High Current Serial Ion Implantation System, Varian Ion Implant Systems, Gloucester, MA, Diamond Semiconductor Group, Inc., 1999.

Shao et al., Plasma Hydrogenation of Strained Si/SiGe/Si heterostructure for layer transfer without ion implantation, Applied Physics Letters 87, 091902, 2005.

Suvorov et al., Silicon Wafer Bonding by Chemical Assembly of a Surface by Molecular Layering and Gas-Cutting, Atomic Energy, V. 91, No. 4, 2001.

Technoalliance, Ion Beam Application Reduces Silicon Substrate Thickness for Solar Cell, Japan Atomic Energy Research Institute, Nov. 1999.

Tiedje, et al., Limiting Efficiency of Silicon Solar Cells, IEEE Transactions on Electron Devices, V. ED-31, No. 5, May 1984.

Tong, et al., Low Temperature Si Layer Splitting, Proceedings 1997 IEEE International SOI Conference, Oct. 1997.

Ulyashin, Solar Cell Activity at SMN, University of Oslo, Center for Material Science and Nanotechnology, Oslo, Norway, Nov. 2005.

Usenko, et al., Blistering on Silicon Surface Caused by Gettering of Hydrogen on Post-Implantation Defects, Mat. Res. Soc., Symp. Proc. vol. 681E, 2001.

Usenko, et al., Hydrogen Platelet Layer in Silicon Formed from Hydrogen Trapped onto Microbubbles of Gases, Mat. Res. Soc., Symp. Proc. vol. 719, 2002.

Wang et al., Microstructure Evolution of Hydrogen-Implanted Silicon during the Annealing Process, Elsevier, Microelectronic Engineering 66 (2003), pp. 314-319.

Weldon et al., Mechanism of Silicon Exfoliation induced by Hydrogen/Helium Co-Implantation, Applied Physics Letters, V. 73, No. 25, Dec. 1998.

Weldon et al., On the Mechanism of the Hydrogen-Induced Exfoliation of Silicon, J. Vac. Sci. Technol. B 15(4), Jul./Aug. 1997.

Werner, et al., Crystalline Thin-Film Silicon Solar Cells, 12th European Photovoltaic Solar Energy Conference, Apr. 1994, Amsterdam, the Netherlands.

Wetz et al., Improvement in WL-CSP Reliability by Wafer Thinning, 2003 Electronic Components and Technology Conference.

www.sundoc.bibliothek.uni-halle.de/diss-online/03/03H198/t6.pdf/ Chapter 5—Blistering and splitting mechanisms.

Xiao et al., Direct Determination of the Initial Thermal Evolution Behavior of the Platelet Defects in Hydrogen Implanted Silicon Wafers, Materials Science and Technology, 2005, V. 21, No. 6.

Yablonovitz et al., Intensity Enhancement in Textured Optical Sheets for Solar Cells, IEEE Transactions on Electron Devices, V. ED-29, No. 2., Feb. 1982.

* cited by examiner

METHOD AND STRUCTURE FOR THICK LAYER TRANSFER USING A LINEAR ACCELERATOR

CROSS-REFERENCES TO RELATED APPLICATIONS

The instant nonprovisional patent application claims priority to the following provisional patent applications, each of which is incorporated herein by reference for all purposes: U.S. Provisional Patent Application No. 60/864,584, filed Nov. 6, 2006; and U.S. Provisional Patent Application No. 60/886,827, filed Jan. 26, 2007.

BACKGROUND OF THE INVENTION

The present invention relates generally to technique including a method and a structure for forming substrates using a layer transfer technique. More particularly, the present method and system provides a method and system using a linear accelerator process for the manufacture of thick free standing semiconductor films for a variety of applications including photovoltaic cells. But it will be recognized that the invention has a wider range of applicability; it can also be applied to other types of applications such as for three-dimensional packaging of integrated semiconductor devices, photonic or optoelectronic devices, piezoelectronic devices, flat panel displays, microelectromechanical systems ("MEMS"), nano-technology structures, sensors, actuators, integrated circuits, biological and biomedical devices, and the like.

Alternative embodiments in accordance with the present invention relate generally to techniques including methods and apparatuses for cleaving free standing films from material in bulk form, such as a single crystal silicon ingot. Such free standing films are useful as a photovoltaic material such as a solar cell. But, it will be recognized that embodiments of the invention have a wider range of applicability; it can also be applied to other types of applications such as for three-dimensional packaging of integrated semiconductor devices, photonic devices, piezoelectronic devices, flat panel displays, microelectromechanical systems ("MEMS"), nano-technology structures, sensors, actuators, integrated circuits, biological and biomedical devices, and the like.

From the beginning of time, human beings have relied upon the "sun" to derive almost all useful forms of energy. Such energy comes from petroleum, radiant, wood, and various forms of thermal energy. As merely an example, human beings have relied heavily upon petroleum sources such as coal and gas for much of their needs. Unfortunately, such petroleum sources have become depleted and have lead to other problems. As a replacement, in part, solar energy has been proposed to reduce our reliance on petroleum sources. As merely an example, solar energy can be derived from "solar cells" commonly made of silicon.

The silicon solar cell generates electrical power when exposed to solar radiation from the sun. The radiation interacts with atoms of the silicon and forms electrons and holes that migrate to p-doped and n-doped regions in the silicon body and create voltage differentials and an electric current between the doped regions. Depending upon the application, solar cells have been integrated with concentrating elements to improve efficiency. As an example, solar radiation accumulates and focuses using concentrating elements that direct such radiation to one or more portions of active photovoltaic materials. Although effective, these solar cells still have many limitations.

As merely an example, solar cells rely upon starting materials such as silicon. Such silicon is often made using either polysilicon (i.e. polycrystalline silicon) and/or single crystal silicon materials. These materials are often difficult to manufacture. Polysilicon cells are often formed by manufacturing polysilicon plates. Although these plates may be formed effectively in a cost effective manner, they do not possess optimum properties for highly effective solar cells. In particular, polysilicon plates do not exhibit the highest possible efficiency in capturing solar energy and converting the captured solar energy into usable electrical power.

By contrast, single crystal silicon (c-Si) has suitable properties for high grade solar cells. Such single crystal silicon is, however, expensive to manufacture and is also difficult to use for solar applications in an efficient and cost effective manner.

Generally, thin-film solar cells are less expensive by using less silicon material but their amorphous or polycrystalline structure are less efficient than the more expensive bulk silicon cells made from single-crystal silicon substrates. These and other limitations can be found throughout the present specification and more particularly below.

Additionally, both polysilicon and single-crystal silicon materials suffer from material losses during conventional manufacturing called "kerf loss", where the sawing process eliminates as much as 40% and even up to 60% of the starting material from a cast or grown boule and singulate the material into a wafer form factor. This is a highly inefficient method of preparing thin polysilicon or single-crystal silicon plates for solar cell use.

In particular, conventional techniques for manufacturing single crystal silicon substrates for incorporation into solar cells, typically involves the physical separation of thin single crystal silicon layers from a single crystal silicon ingot originally grown. One example of such a conventional manufacturing technique is inner diameter (ID) sawing.

The ID sawing technique employs a circular saw having a blade located on its inner diameter. The ingot is pushed through the center of the saw until a desired wafer thickness is on the other side of the saw. With the saw rotating, the saw is then raised or lowered to allow the blade to slice through the ingot. The ID sawing method offers a number of possible disadvantages. One is that the saw must be of minimum thickness to be sufficiently strong to withstand the stress of the sawing action. However, an amount of silicon material corresponding to this saw thickness (the kerf) is lost by this cutting. Use of even the thinnest saw blade that can reliably be used to saw the ingot, may result in losses of expensive, pure single crystal silicon to the kerf. For example, a typical saw blade kerf has a width of 300 µm, where an individual sliced wafer may have a width of only 800 µm. Use of the conventional wafer sawing technique can thus result in kerf losses of expensive, pure starting material amounting to as high as 60% of the entire ingot. Another disadvantage of the conventional ID sawing technique is that slices can only be separated one at a time, thus limiting throughput and elevating cost.

Partly in response to the limited throughput of sawing, the alternative conventional technique of wire sawing has been developed. In wire sawing, a network of rapidly moving parallel wires is provided. The side of an ingot is then contacted with the moving wires in an environment including oil and abrasives, resulting in simultaneous slicing of the wafer into a plurality of wafers. The advantages of this technique over ID sawing includes parallel sawing of the boule and producing thinner wafers of 180-250 um with a more modest 190-250 um kerf loss. While effective, conventional wire sawing also offers disadvantages, in particular a still significant kerf loss of about 50% attributable to the thickness of the wire, and possible contamination by exposure of the substrate to the oil and abrasives.

From the above, it is seen that techniques for forming suitable substrate materials of high quality and low cost are highly desired. Cost-effective and efficient techniques for the manufacture of single crystal silicon substrates for incorporation into solar cells, are also desirable.

BRIEF SUMMARY OF THE INVENTION

According to embodiments of the present invention, techniques including a method and a structure for forming substrates using a layer transfer technique are provided. More particularly, the present method and system provides a method and system using a linear accelerator process for the manufacture of thick free standing semiconductor films for a variety of applications including photovoltaic cells. But it will be recognized that the invention has a wider range of applicability; it can also be applied to other types of applications such as for three-dimensional packaging of integrated semiconductor devices, photonic or optoelectronic devices, piezoelectronic devices, flat panel displays, microelectromechanical systems ("MEMS"), nano-technology structures, sensors, actuators, integrated circuits, biological and biomedical devices, and the like.

In a specific embodiment, the present invention provides a method for fabricating free standing thickness of materials using one or more semiconductor substrates, e.g., single crystal silicon, polycrystalline silicon, polysilicon, silicon germanium, germanium, group III/IV materials, and others. In a specific embodiment, the present method includes providing a semiconductor substrate having a surface region and a thickness. The method includes subjecting the surface region of the semiconductor substrate to a first plurality of high energy particles generated using a linear accelerator to form a region of a plurality of gettering sites within a cleave region, the cleave region being provided beneath the surface region to defined a thickness of material to be detached, the semiconductor substrate being maintained at a first temperature. In a specific embodiment, the method includes subjecting the surface region of the semiconductor substrate to a second plurality of high energy particles generated using the linear accelerator, the second plurality of high energy particles being provided to increase a stress level of the cleave region from a first stress level to a second stress level. In a preferred embodiment, the semiconductor substrate is maintained at a second temperature, which is higher than the first temperature. The method frees the thickness of detachable material using a cleaving process, e.g., controlled cleaving process.

In an alternative specific embodiment, the present invention provides a method for forming a free standing thickness of layer transferred material, e.g., single crystal silicon, polysilicon, polycrystalline silicon, silicon germanium, germanium, group III/IV materials, and others. The method includes providing a crystalline substrate material having a surface region. The method includes introducing a plurality of first particles at a first dose range and within a first temperature range through the surface region to an accumulation region of the crystalline substrate material to form an implant profile having a peak concentration and a base spatially disposed within a dimension to form the accumulation region. In a specific embodiment, the first dose range is less than an amount sufficient to cause the plurality of particles to be permanently disposed in the crystalline substrate material at the accumulation region to form a cleave region. In a specific embodiment, the first particles cause a plurality of defects in the crystalline material in the cleave region, which is preferably defined by a depth greater than about 20 microns beneath the surface region and a slice of crystalline material to be detached between the cleave region and the surface region.

In an optional specific embodiment, the method includes performing a treatment process on the crystalline substrate material to cause formation of a plurality of substantially permanent defects that have been quenched in the crystalline substrate material from the first particles in the accumulation region. The method also includes introducing a plurality of second particles at a second dose range and a second temperature range into the accumulation region to increase an internal stress in the accumulation region to cause a portion of the accumulation region to be cleavable. In a specific embodiment, the method includes forming a free standing thickness of crystalline material by detaching the thickness of crystalline material from a remaining portion of the crystalline substrate material.

According to embodiments of the present invention, a free standing film may be separated from a bulk material. In one embodiment, a free standing layer of semiconductor material such as single crystal silicon, having a thickness of 20 m or greater, may be cleaved from a bulk ingot utilizing high energy implantation. In one embodiment, the cleaving involves implanting ions at a first, lower temperature to create a cleave region, and then implanting ions at a second, higher temperature to enhance stress in the cleave region. Cleaving the ingot in this manner substantially reduces the amount of semiconductor material that is otherwise lost to the kerf in a conventional blade cutting process. The resulting cleaved free standing film may be particularly suited for use in the collection of solar energy.

An embodiment of a method in accordance with the present invention for slicing a plurality of free standing films from a bulk material, comprises, providing a bulk material having a surface region and a weight of about 3 kilograms, repeatedly cleaving a plurality of free standing films from the bulk material, each of the plurality of free standing films having a thickness of greater than about 20 microns to less than about 150 microns, and using more than about 70% of the weight of the bulk material for the plurality of free standing films, the plurality of free standing films having substantially the weight of 70% of the weight of about 3 kilograms of the bulk material.

Numerous benefits are achieved over pre-existing techniques using embodiments of the present invention. In particular, embodiments of the present invention use a cost effective linear accelerator device and method for providing a high energy implant process for layer transfer techniques. Such linear accelerator device may include, but is not limited to, a drift tube technique, a Radio Frequency Quadrupole, commonly called RFQ, or combinations of these, (for example, a RFQ combined with a Drift Tube Linac or a RFI (RF-Focused Interdigital) Linear Accelerator), and other suitable techniques. In a preferred embodiment, the linear accelerator provides an implantation process that forms a thickness of transferable material defined by a cleave plane in a donor substrate. The thickness of transferable material may be further processed to provide a high quality semiconductor material for application such as photovoltaic devices, 3D MEMS or integrated circuits, IC packaging, semiconductor devices, any combination of these, and others. In a preferred embodiment, the present method provides for single crystal silicon for highly efficient photovoltaic cells among others. In a preferred embodiment, the present method and structure use a low initial dose of energetic particles, which allows the process to be cost effective and efficient. Additionally, the present method and structure allow for fabrication of large area substrates. It will be found that this invention can be applied to make thin silicon material plates of the desired form factor (for example, 50 um-200 um thickness with a area size from 15 cm×15 cm to upwards of 1 m×1 m or more for polysilicon plates). In an alternative preferred embodiment, embodiments according to the present invention may provide for a seed layer that can further provide for layering of a hetero-structure epitaxial process. The hetero-structure epitaxial process can be used to form thin multi-junction photovoltaic cells, among others. Merely as an example, GaAs and GaInP layers may be deposited heteroepitaxially onto a germanium seed layer, which is a transferred layer formed using an implant process according to an embodiment of the present invention. In a specific embodiment, the present method can be applied successively to cleaving multiple slices from a single ingot, e.g., silicon boule. That is, the method can be repeated to successively cleave slices (similar to cutting slices of bread from a baked loaf) according to a specific embodiment. Of course, there can be other variations, modifications, and alternatives.

Depending upon the embodiment, one or more of these benefits may be achieved. These and other benefits may be described throughout the present specification and more particularly below.

DETAILED DESCRIPTION OF THE INVENTION

Figure 1:
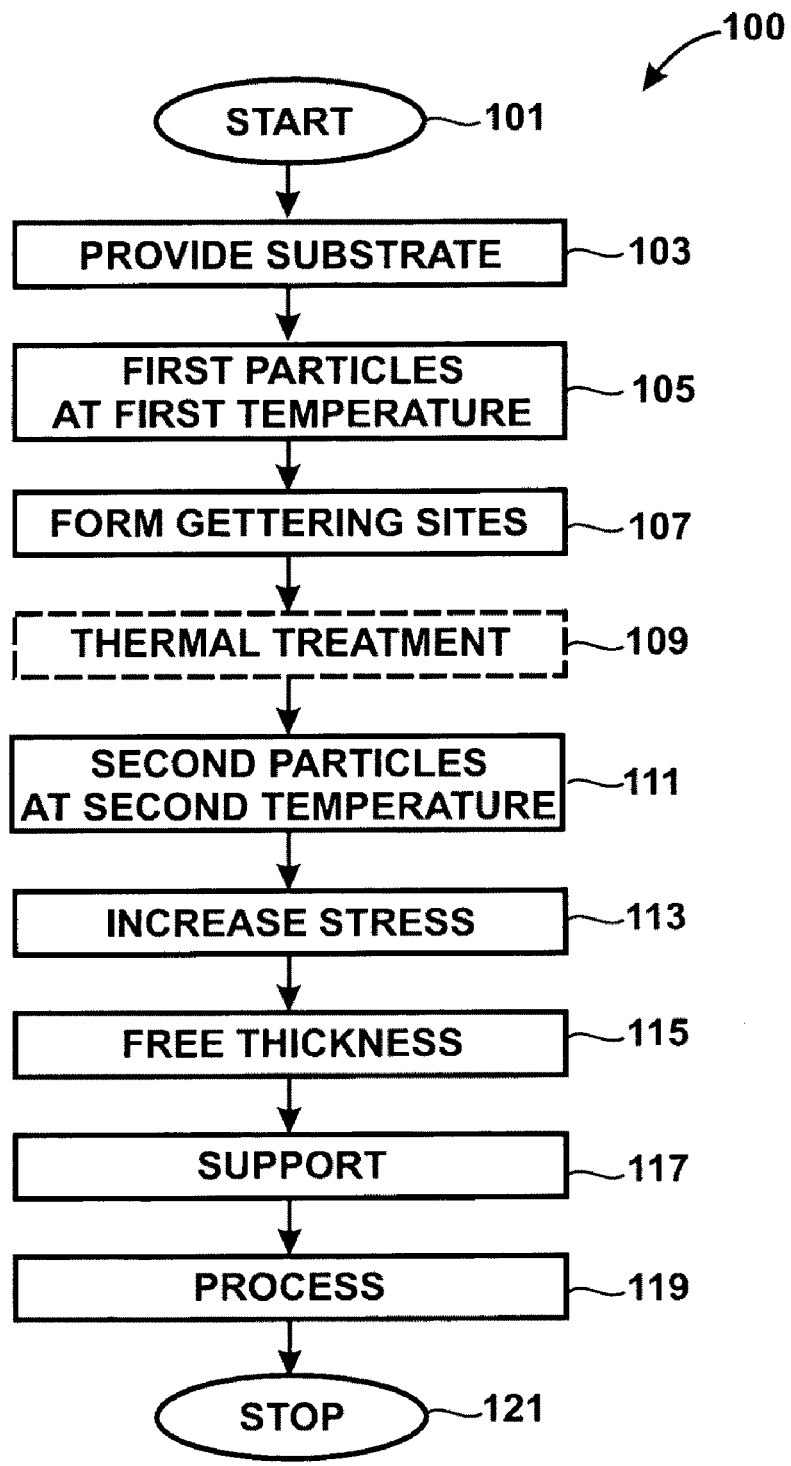
FIG. 1 is a simplified process flow illustrating a method of forming substrates using a thick layer transfer process according to an embodiment of the present invention.

According to embodiments of the present invention, techniques including a method for forming substrates are provided. More particularly, embodiments according to the present invention provide a method to form a free standing layer of material from a semiconductor material. In a specific embodiment, the free standing layer of material is provided using a plurality of high energy particles to cause a formation of a cleave plane in the semiconductor substrate. The method according to present invent invention can be used in a variety of application, including but not limited to semiconductor device packaging, photovoltaic cells, MEMS devices, and others.

According to embodiments of the present invention, a free standing film may be separated from a bulk material. In one embodiment, a free standing layer of semiconductor material such as single crystal silicon, having a thickness of 20 μm or greater, may be cleaved from a bulk ingot utilizing high energy implantation. In one embodiment, the cleaving involves implanting ions at a first, lower temperature to create a cleave region, and then implanting ions at a second, higher temperature to enhance stress in the cleave region. Cleaving the ingot in this manner substantially reduces the amount of semiconductor material that is otherwise lost to the kerf in a conventional blade cutting process. In addition to enhancing the efficiency of the cleave action, managing parameters such as ion dose and temperature profile is also important to limit and control the radiation damage to the material that is separated. The resulting cleaved free standing film may be particularly suited for use in the collection of solar energy.

For purposes of the following disclosure, a "free standing film" or "free standing layer" is defined as a film of material that can maintain its structural integrity (i.e not crumble or break apart), without being in contact with a supporting member such as a handle or transfer substrate. Typically, very thin films (for example silicon films thinner than about 5-10 μm) are unable to be handled without breaking. Conventionally, such thin films are manipulated using a supporting structure, which may also be needed to create the thin film in the first place. Handling of thicker films (i.e. silicon films having a thickness of between 20-50 μm) may be facilitated by the use of a support, but such a support is not mandatory. Accordingly embodiments of the present invention relate the fabrication of free standing films of silicon having a thickness of greater than 20 μm.

Embodiments in accordance with the present invention are not limited to forming free standing films. Alternative embodiments may involve the formation of films supported by a substrate. Moreover, irrespective of whether the films used in solar photovoltaic applications are truly free-standing or supported with handling or transfer substrates during photovoltaic cell processing, processed cells are usually mounted onto a mechanical surface such as glass or plastic for the final application as an integral part of a photovoltaic module.

Also for purposes of the following disclosure, "bulk material" refers to a material present in bulk form. Examples of such bulk material include a substantially circular ingot or boule of single crystal silicon as grown, or a grown single crystal silicon ingot having sides shaved to exhibit other than a substantially circular cross-sectional profile. Other examples of bulk materials include polycrystalline silicon plates or tiles exhibiting a square, rectangular, or trapezoidal profile. Still other examples of bulk materials are described below.

In a specific embodiment, the present method may be applied successively to cleave multiple slices of free standing layers from a single ingot, e.g., silicon boule. That is, the method can be repeated to successively cleave slices (similar to cutting slices of bread from a baked loaf) according to a specific embodiment. Of course, there can be other variations, modifications, and alternatives.

In a specific embodiment of a process flow 100 shown in FIG. 1, a method for fabricating free standing thickness of materials using one or more semiconductor substrates is provided as follows:

1. Provide (103) a semiconductor substrate having a surface region and a thickness;
2. Subject (105) the surface region of the semiconductor substrate to a first plurality of high velocity particles generated using a linear accelerator;
3. Form (107) a region of a plurality of gettering sites within a cleave region, which is provided beneath the surface region to defined a thickness of material to be detached, while the cleave region is maintained at a first temperature;
4. Optionally, perform (109) a thermal treatment process on the semiconductor substrate to further form the plurality of gettering sites within the cleave region;
5. Subject (111) the surface region of the semiconductor substrate to a second plurality of high energy particles generated using the linear accelerator;
6. Increase (113) a stress level of the cleave region from a first stress level to a second stress level from the second plurality of high energy particles, while the semiconductor substrate is maintained at a second temperature;
7. Free (115) the thickness of detachable material, which is free standing, using a cleaving process, while the detachable material is free from an overlying support member or the like;
8. Place (117) the thickness of detached material on a support member;
9. Perform (119) one or more processes on the thickness of detached material;
10. Optionally, perform one or more processes on the semiconductor substrate before subjecting the surface region with the first plurality of high energy particles in step (2); and
11. Perform other steps as desired.

The above sequence of steps provide a method of forming substrates using a linear accelerator process according to an embodiment of the present invention. As shown, the method includes using a co-implant process to remove a film of material, which is preferably thick and free standing. Other alternatives can also be provided where steps may be added, one or more steps may be removed, or one or more steps may be provided in a different sequence without departing from the scope of the claims herein.

Figure 1A:
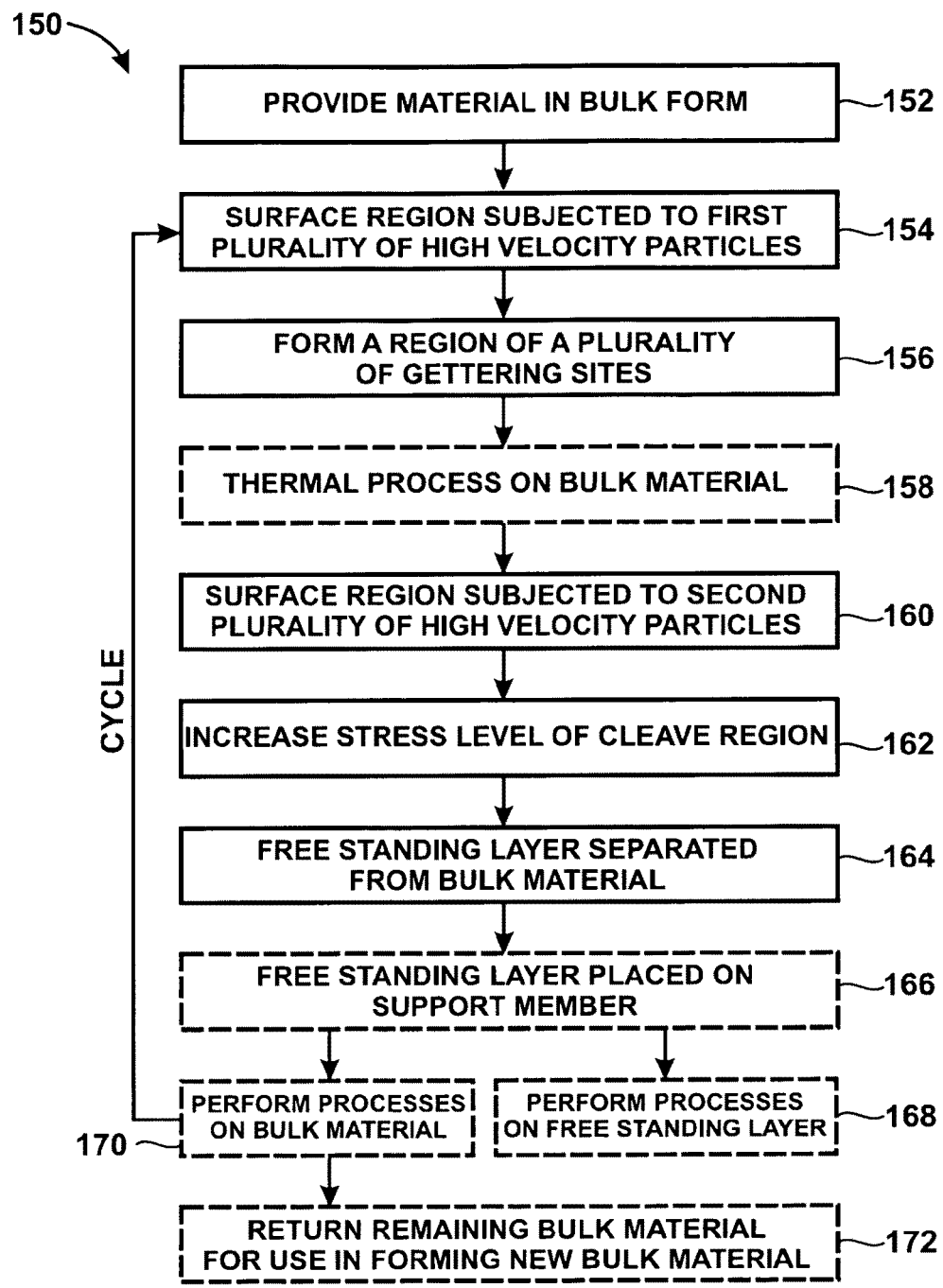
FIG. 1A is a simplified process flow illustrating a method of forming substrates using a thick layer transfer process according to an embodiment of the present invention.
Figure 2:
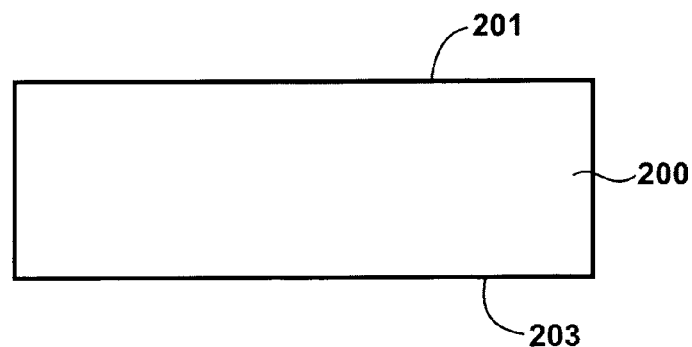
FIG. 2-8 are simplified diagrams illustrating a method of forming substrates using a thick layer transfer process according to an embodiment of the present invention.

In a specific embodiment, a method for fabricating a free standing layer from a bulk material shown in the simplified flow diagram of FIG. 1A as follows.

1. In a first step 152 of process flow 150, a material is provided in bulk form (i.e. ingot, tile, plate) having a surface region and a thickness;
2. In a second step 154, the surface region is subjected to a first plurality of high energy particles;
3. In a third step 156, a region of a plurality of gettering sites is formed within a cleave region, which is provided beneath the surface region to define a thickness of the free standing layer that is to be detached, while the cleave region is maintained at a first temperature;
4. In a fourth step 158, an optional thermal treatment process is performed on the bulk material to further form the plurality of gettering sites within the cleave region;
5. In a fifth step 160, the surface region of the bulk material is subjected to a second plurality of high energy particles;
6. In a sixth step 162, a stress level of the cleave region is increased from a first stress level to a second stress level from the second plurality of high energy particles, while the bulk material is maintained at a second temperature;
7. In a seventh step 164, the free standing layer is freed from the bulk material using a cleaving process, while the free standing layer is free from an overlying support member or the like;
8. In an optional eighth step 166, the free standing layer is placed on a support member;
9. In an optional ninth step 168, one or more processes are performed on the free standing layer;
10. In an optional tenth step 170, one or more processes are performed on the bulk material before returning to step 152 to subject the surface region with the first plurality of high energy particles;
11. Once the free standing layers have been separated from the parent bulk material, in step 172 the remaining bulk material may be used as raw material for the formation of additional bulk material, for example by returning unused single crystal silicon to the melt for formation of additional ingots; and
12. Perform other steps as desired.

The above sequence of steps provide a method of forming free standing layers of material according to embodiments of the present invention. As shown, the method includes using an implant process to remove a free standing layer from a bulk material. Other alternatives can also be provided where steps may be added, one or more steps may be removed, or one or more steps may be provided in a different sequence without departing from the scope of the claims herein. For example, each step including the implantation steps may include a thermal process sequence, defined as a constant temperature or a program of varying temperatures. In addition, the cycles of implant/thermal processing steps 154-162 may be further split into more cycles of smaller dose implants in order to improve the cleave process and/or the film lifetime. Further details of the present method can be found throughout the present specific and more particularly below.

FIG. 2-8 are simplified diagrams illustrating a method of forming substrates or free standing layers using a thick layer transfer process according to an embodiment of the present invention. These diagrams are merely examples, which should not unduly limit the scope of the claims recited herein. One of ordinary skill in the art would recognize many variations, modifications, and alternatives.

As shown, the method begins by providing a semiconductor substrate or semiconductor material in bulk form 200 having a surface region 201, a backside 203 and a thickness 204. Such thickness can be an entirety of an ingot or sliced from a larger ingot or the like. Specifically, the thickness 204 may represent that of an entirety of the bulk material in its original form (e.g. as an entire ingot, boule, tile, or plate), or may represent a thickness of the bulk material previously separated from its original form (e.g. by sawing or slicing an original ingot, boule, tile, or plate). In a specific embodiment, the semiconductor substrate or bulk material can be a single crystal silicon wafer or ingot, a polysilicon cast wafer, tile, or substrate, a silicon germanium wafer, a germanium wafer, a substrate of group III/V materials, group II/VI materials, gallium nitride, or the like. In a preferred embodiment, the substrate or bulk material can be a photosensitive material. Of course there can be other variations, modifications, and alternatives.

Figure 3:
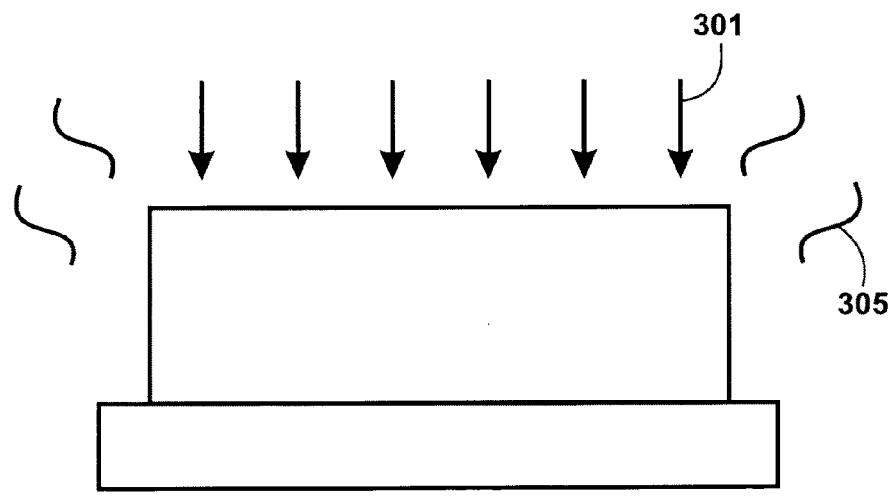

Referring to FIG. 3, the method includes subjecting the surface region of the semiconductor substrate or bulk material to a first plurality of high energy particles 301. In accordance with particular embodiments, the high energy particles 301 can be generated using a linear accelerator.

Figure 4:
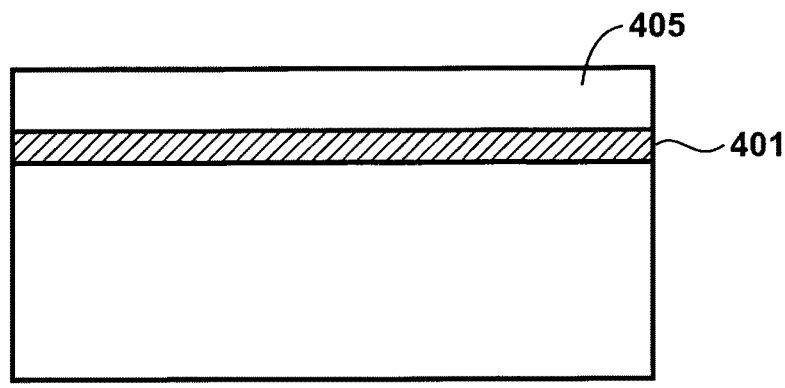

In a specific embodiment, the particles cause formation of a plurality of gettering sites or an accumulation region within a cleave region 401, which is provided beneath the surface region to define a thickness of the bulk material 405 that is to be detached (in some embodiments as a free standing layer), as shown in the simplified diagram of FIG. 4. Preferably, the first plurality of high energy particles provide an implant profile having a peak concentration and a base spatially disposed within a depth of the semiconductor substrate. Preferably, the base can have a width of about 2 Rp and less, where the depth variation of an implant concentration profile is called the longitudinal straggle (denoted by Rp). For a 3.5 MeV hydrogen implant in silicon, the implant depth is about 120 µm, and the Rp is about 3 µm.

In one preferred embodiment, the cleave region is maintained at a first temperature 305, which can be provided directly or indirectly. That is, the temperature can be provided by convection, conduction, radiation, or a combination of these techniques according to a specific embodiment. Additionally, the high-energy particle beam may also provide part of the thermal energy and in combination with an external temperature source to achieve the desired implant temperature. In certain embodiments, the high-energy particle beam alone may provide the entire thermal energy desired for implant. That is, the high energy particle beam can be provided that directly causes energy to be converted into thermal energy to increase the temperature of the substrate or bulk material. Of course there can be other variations, modifications, and alternatives.

Depending upon the application, according to particular embodiments smaller mass particles are generally selected to decrease the energy requirement for implantation to a desired depth in a material and to reduce a possibility of damage to the material region according to a preferred embodiment. That is, smaller mass particles more easily travel through the substrate material to the selected depth without substantially damaging the material region that the particles traverse through. For example, the smaller mass particles (or energetic particles) can be almost any charged (e.g., positive or negative) and or neutral atoms or molecules, or electrons, or the like. In a specific embodiment, the particles can be neutral or charged particles including ions such as ion species of hydrogen and its isotopes, rare gas ions such as helium and its isotopes, and neon, or others depending upon the embodiment. The particles can also be derived from compounds such as gases, e.g., hydrogen gas, water vapor, methane, and hydrogen compounds, and other light atomic mass particles. Alternatively, the particles can be any combination of the above particles, and or ions and or molecular species and or atomic species. The particles generally have sufficient kinetic energy to penetrate through the surface to the selected depth underneath the surface.

For example, using hydrogen as the implanted species into the silicon wafer as an example, the implantation process is performed using a specific set of conditions. Implantation dose ranges of hydrogen from about $1\times10^{15}$ to about $1\times10^{16}$ atoms/cm$^2$, and preferably the dose of implanted hydrogen is less than about $8\times10^{16}$ atoms/cm$^2$, and may be less than about $5\times10^{16}$ atoms/cm$^2$. Implantation energy ranges from about 1 MeV and greater to about 2 MeV or even 5 MeV and greater, for the formation of thick films useful for photovoltaic applications. Implantation temperature ranges from about −50 to about +50 Degrees Celsius, may between about 100-250 Degree Celsius, and is preferably less than about 400 Degrees Celsius to prevent a possibility of hydrogen ions from diffusing out of the implanted silicon wafer. The hydrogen ions can be selectively introduced into the silicon wafer to the selected depth at an accuracy of about ±0.03 to ±1.5 microns. Of course, the type of ion used and process conditions depend upon the application.

For higher implant energies, it is particularly useful to have a substantially pure proton implantation (e.g., positive or negatively charged) to allow for a maximum range of the cleaving plane within the reusable substrate. Using silicon as an example, the energy range of implantation can be quite large and span from a few keV for template formation for photovoltaic absorber where a subsequent epitaxial growth is needed to maximize light absorbing efficiency to many MeV yielding substrates measuring hundreds of micron in thickness for use as a solar cell wafer starting material. The general range of implant depth as a function of the implant energy can be calculated using, for example SRIM 2003 (Stopping Range In Matter) or a Monte Carlo simulation program (http://www.srim.org/). In a specific embodiment, the silicon film thickness (which may be free standing) ranges from about 20 or 50 micrometers to about 200 micrometers using proton implant energy ranges from about 2 MeV to about 5 MeV. In other embodiments the silicon film may be a free standing silicon layer having a thickness from about 50 micrometers to about 200 micrometers. Of course there can be other variations, modifications, and alternatives.

In a specific embodiment, a silicon film thickness ranges from about 50 um to about 200 um may be formed using a proton implant having an energy range of about 2.1 MeV to about 5 MeV. This range of silicon film thickness allows the detachment of a thickness of a single-crystal silicon substrate equivalent that can be used as a free standing silicon substrates. Single crystal silicon substrates or free standing layers in the thickness range of 50 um to 200 um according to embodiments of the present invention may be used to replace conventional methods of using wafer sawing, etching, and/or polishing processes. As opposed to about 50% kerf loss in the conventional technologies (kerf loss as being defined as the ratio of the material lost during the cutting and wafering operations), the implant cleaving technique according to embodiments of the present invention has virtually no kerf loss resulting in substantial cost savings and material utilization efficiency improvements. Energies higher than 5 MeV may be used to make semiconductor processing alternative substrate materials, but in solar cell manufacturing, 200 um or less is desired for silicon solar cell material thickness for bulk silicon solar cell formation. As a result, thicker silicon substrates are not of particular commercial interest for fabricating solar cell according to a specific embodiment.

In accordance with certain embodiments, implantation energies higher than 5 MeV may be used. Such high energies of implantation may be useful to fabricate free standing layers as substrates of alternative materials in the fabrication of semiconductor devices. In the manufacture of solar cells, however, a free standing material thickness of 200 um or less is generally desired.

As an example, MeV range implant conditions have been disclosed by Reutov et al. (V. F. Reutov and Sh. Sh. Ibragimov, "Method for Fabricating Thin Silicon Wafers", USSR's Inventors Certificate No. 1282757, Dec. 30, 1983), which is hereby incorporated by reference. In V. G. Reutov and Sh. Sh. Ibragimov, the use of up to 7 MeV proton implantation with optional heating during implant and post-implant reusable substrate heating was disclosed to yield detached silicon wafer thicknesses up to 350 um. A thermal cleaving of a 16 micron silicon film using a 1 MeV hydrogen implantation was also disclosed by M. K. Weldon & al., "On the Mechanism of Hydrogen-Induced Exfoliation of Silicon", J. Vac. Sci. Technol., B 15(4), July/August 1997, which is hereby incorporated by reference. The terms "detached" or "transferred silicon thickness" in this context mean that the silicon film thickness formed by the implanted ion range can be released to a free standing state or released to a permanent substrate or a temporary substrate for eventual use as a free standing substrate, or eventually mounted onto a permanent substrate. In a preferred embodiment, the silicon material is sufficiently thick and is free from a handle substrate, which acts as a supporting member. Of course, the particular process for handling and processing of the film will depend on the specific process and application.

Figure 5:
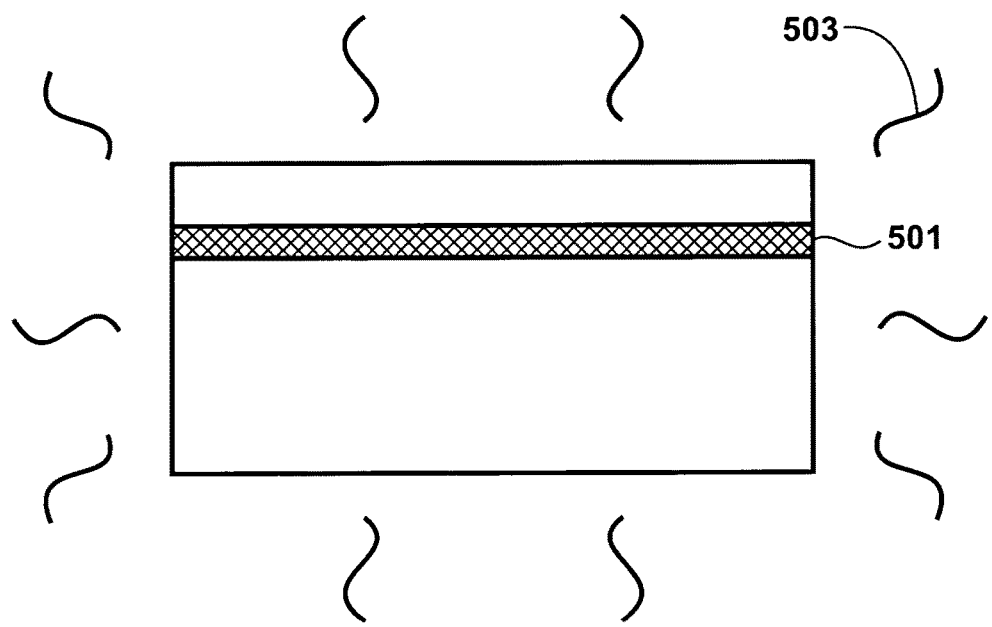

Referring now to FIG. 5, an embodiment in accordance with the present invention may optionally perform a thermal treatment process 503 on the semiconductor substrate or bulk material to further form the plurality of gettering sites within the cleave region. That is, the thermal treatment process anneals out and/or quenches the cleave region to fix 501 the plurality of first particles in place. The thermal treatment provides a fixed network of defects that can act as efficient sites for gettering and accumulating particles in a subsequent implantation or particle accumulation/diffusion process.

Without being tied to a particular theory or mechanism, in a specific embodiment, the increased temperature is believed to precipitate a network of permanent defects, and may also trap a substantial portion of hydrogen from the first plurality of particles. The defect layer, which is substantially permanent, provides a site for efficient collection and trapping of particles from a subsequent implant and/or diffusion process, which will be described in more detail throughout the present specification and more particularly below.

In accordance with one embodiment, the optional thermal treatment can occur using conduction, convection, radiation, or any combination of these techniques. The high-energy particle beam may also provide part of the thermal energy and in combination with a external temperature source to achieve the desired implant temperature. In certain embodiments, the high-energy particle beam alone may provide the entire thermal energy desired for implant. Of course, there can be other variations, modifications, and alternatives.

Figure 6:
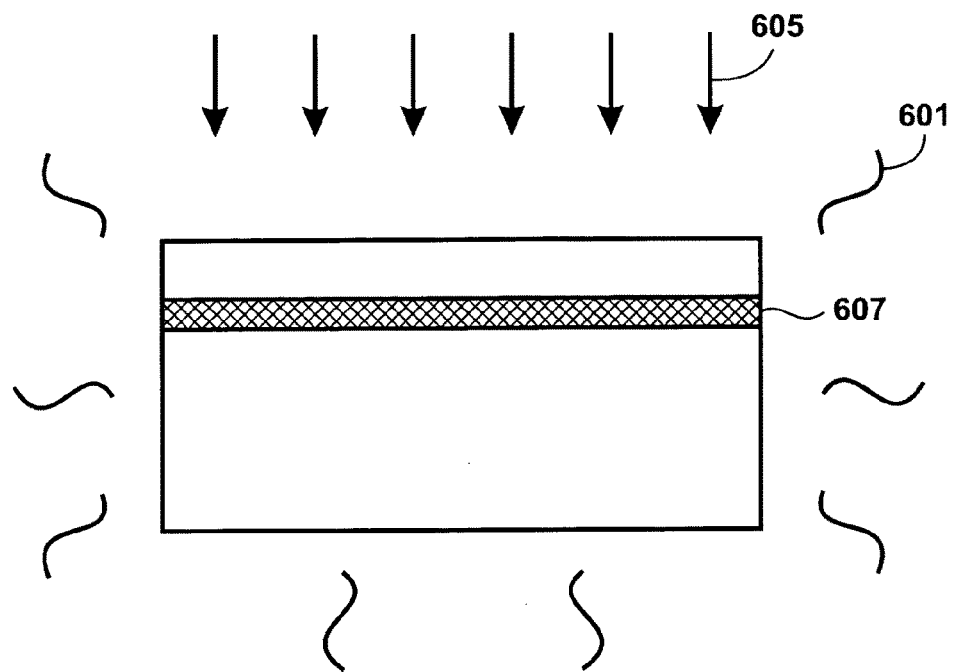
Figure 7:
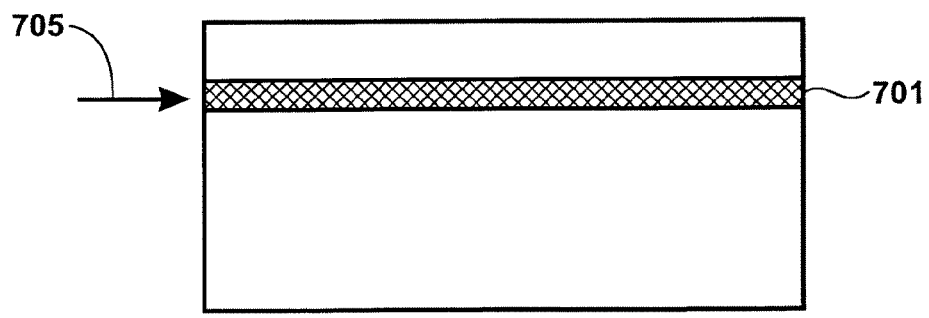

In a specific embodiment, the method includes subjecting the surface region of the semiconductor substrate or bulk material to a second plurality of high energy particles, which may be generated using the linear accelerator, as illustrated in the simplified diagram of FIG. 6. As shown, the method includes the second plurality of high energy particles 605, which are provided in the semiconductor substrate or bulk material. The second particles are introduced into the cleave region 607, which increases a stress level of the cleave region from a first stress level to a second stress level from the second plurality of high velocity particles. In a specific embodiment, the second stress level is suitable for a subsequent cleaving process. In a particular embodiment, the semiconductor substrate or bulk material is maintained at a second temperature 601, which is higher than the first temperature.

Using hydrogen as the species implanted into the bulk single crystal silicon wafer material in the second implantation step as an example, the implantation process is performed using a specific set of conditions. Implantation dose ranges from about $5 \times 10^{15}$ to about $5 \times 10^{16}$ atoms/cm$^2$, and preferably the dose is less than about $1-5 \times 10^{17}$ atoms/cm$^2$. Implantation energy ranges from about 0.5 MeV and greater to about 2 or 5 MeV and greater for the formation of thick films useful for photovoltaic applications. Implant dose rate can be provided at about 500 microamperes to about 50 milliamperes and a total dose rate can be calculated by integrating an implantation rate over the expanded beam area. Implantation temperature ranges from about −50 Degree Celsius to about 550 Degrees Celsius, and is preferably greater than about 400 Degrees Celsius. The hydrogen ions can be selectively introduced into the silicon wafer to the selected depth at an accuracy of about ±0.03 to ±1.5 microns. In a specific embodiment, the temperature and dose are selected to allow for efficient capture of molecular hydrogen, while there may be some diffusion of mono-atomic hydrogen. Of course, the type of ion used and process conditions depend upon the application.

For higher implant energies as noted above, it is particularly useful to have a substantially pure proton implantation (e.g., positive or negatively charged) to allow for a maximum range of the cleaving plane within the reusable substrate. Using silicon as an example, the energy range of implantation can be quite large and span from a few keV for template formation for photovoltaic absorber where a subsequent epitaxial growth is needed to maximize light absorbing efficiency to many MeV yielding substrates measuring hundreds of micron in thickness for use as a solar cell wafer starting material. The general range of implant depth as a function of the implant energy can be calculated using, for example SRIM 2003 (Stopping Range In Matter) or a Monte Carlo simulation program (http://www.srim.org/). In a specific embodiment, the silicon film thickness ranges from about 50 micrometers to about 100 micrometers using proton implant energy ranges from about 2 MeV to about 3.25 or 5 MeV. Of course there can be other variations, modifications, and alternatives.

Effectively, the implanted particles add stress or reduce fracture energy along a plane parallel to the top surface of the substrate or bulk material at the selected depth. The energies depend, in part, upon the implantation species and conditions. These particles reduce a fracture energy level of the substrate or bulk material at the selected depth. This allows for a controlled cleave along the implanted plane at the selected depth. Implantation can occur under conditions such that the energy state of the substrate or bulk material at all internal locations is insufficient to initiate a non-reversible fracture (i.e., separation or cleaving) in the substrate or bulk material. It should be noted, however, that implantation does generally cause a certain amount of defects (e.g., micro-detects) in the substrate or bulk material that can typically at least partially be repaired by subsequent heat treatment, e.g., thermal annealing or rapid thermal annealing.

In a specific embodiment, the present method uses a mass-selected high-energy implant approach, which has the appropriate beam intensity. To be cost-effective, the implant beam current should be on the order of a few tens of milliamps of H$^+$ or H$^-$ ion beam current. If the system can implant such sufficiently high energies, $H_2^+$ ions can also be advantageously utilized for achieving higher dose rates. Such ion implant apparatuses have been made recently available by the use of radio-frequency quadrupole linear accelerator (RFQ-Linac) or Drift-Tube Linac (DTL), or RF (Radio)-Focused Interdigitated (RFI) technology. These are available from companies such as Accsys Technology Inc. of Pleasanton, Calif., Linac Systems, LLC of Albuquerque, N. Mex. 87109, and others.

In a specific embodiment, these approaches use RF acceleration of an extracted proton beam to increase the total energy of the proton beam from a range of approximately 20-100 keV to 0.5 to 7 MeV or more. The output beam is usually on the order of a few millimeters in diameter and for use in this application would require the use of beam expansion to the order of a few hundred millimeters on a side to a meter or more in order to keep the power flux impinging on the target surface from becoming too large and possibly overheating or damaging the target surface. The proton current available with these technologies can be up to 100 mA or more. As a specific example, assuming 100 kW of beam power, a 3.25 MeV RFQ/RFI-Linac would yield a proton beam current of about 31 mA. Using a dose of approximately $1\times10^{16}$ H/cm$^2$ and an expanded beam of about 500 mm×500 mm, the silicon area processed per hour at the target implantation dose is about 7 square meters while the power flux is kept to about 13 Watts/cm$^2$. This combination of parameters makes this approach particularly practical for cost effective solar cell production. Of course, there can be other variations, alternatives, and modifications.

Optionally, specific embodiments of methods in accordance with the present invention include a thermal treatment process after the implanting process. According to a specific embodiment, the present method uses a thermal process ranging from about 450 to about 600 Degrees Celsius for silicon material. In a preferred embodiment, the thermal treatment can occur using conduction, convection, radiation, or any combination of these techniques. The high-energy particle beam may also provide part of the thermal energy and in combination with a external temperature source to achieve the desired implant temperature. In certain embodiment, the high-energy particle beam alone may provide the entire thermal energy desired for implant. In a preferred embodiment, the treatment process occurs to season the cleave region for a subsequent cleave process. Of course, there can be other variations, modifications, and alternatives.

Figure 8:
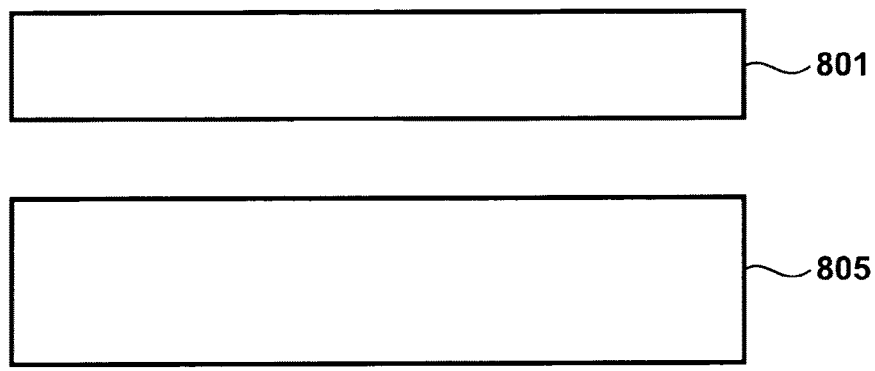

A specific embodiment of a method according to the present invention includes a step of freeing the thickness of detachable material, which is free standing, using a cleaving process, while the detachable material is free from an overlying support member or the like, as illustrated by FIG. 8. As shown, the detachable material 801 is removed from the remaining substrate portion or bulk material 805. In a specific embodiment, the step of freeing can be performed using a controlled cleaving process. The controlled cleaving process provides a selected energy within a portion of the cleave region of the donor substrate. As merely an example, the controlled cleaving process has been described in U.S. Pat. No. 6,013,563 titled Controlled Cleaving Process, commonly assigned to Silicon Genesis Corporation of San Jose, Calif., and hereby incorporated by reference for all purposes. As shown, the method in accordance with an embodiment of the present invention frees the thickness of material (which may be free standing) from the substrate or bulk material to completely remove the thickness of material. Of course, there can be other variations, alternatives, and modifications.

In one embodiment, the method uses one or more patterned regions to facilitate initiation of a cleaving action. In a specific embodiment, the present method provides a semiconductor substrate having a surface region and a thickness. The method includes subjecting the surface region of the semiconductor substrate to a first plurality of high energy particles generated using a linear accelerator to form a patterned region of a plurality of gettering sites within a cleave region. In a preferred embodiment, the cleave region is provided beneath the surface region to defined a thickness of material to be detached. The semiconductor substrate is maintained at a first temperature. The method also includes subjecting the semiconductor substrate to a treatment process, e.g., thermal treatment. The method includes subjecting the surface region of the semiconductor substrate to a second plurality of high energy particles, which have been provided to increase a stress level of the cleave region from a first stress level to a second stress level. The method includes initiating the cleaving action at a selected region of the patterned region to detach a portion of the thickness of detachable material using a cleaving process and freeing the thickness of detachable material using a cleaving process.

In one embodiment, the patterned implant sequence subjects the surface to a dose variation where the initiation area is usually developed using a higher dose and/or thermal budget sequence. Propagation of the cleaving action to complete the cleaving action can occur using additional dosed regions to guide the propagating cleave front. Alternatively, cleaving propagation can be accomplished by following a depth that is guided using stress-control. Propagation of the cleaving can also be achieved by following a natural crystallographic cleave plane. One or more of these techniques may be applied in conjunction with one another. Some or most of the area may be implanted at a lesser dose or not implanted at all depending on the particular cleaving technique used. Such lower dosed regions can help improve overall productivity of the implantation system by reducing the total dose needed to detach each film from the substrate.

In a specific embodiment, the present method can perform other processes. For example, the method can place the thickness of detached material on a support member, which is later processed. Additionally or optionally, the method in accordance with an embodiment of the present invention performs one or more processes on the semiconductor substrate or bulk material before subjecting the surface region with the first plurality of high energy particles, or between the implanting step(s) and the cleaving step. Depending upon the particular embodiment, the processes can be for the formation of photovoltaic cells, or layers used within a cell process, integrated circuits, optical devices, any combination of these, and the like. Of course, there can be other variations, modifications, and alternatives.

Figure 9:
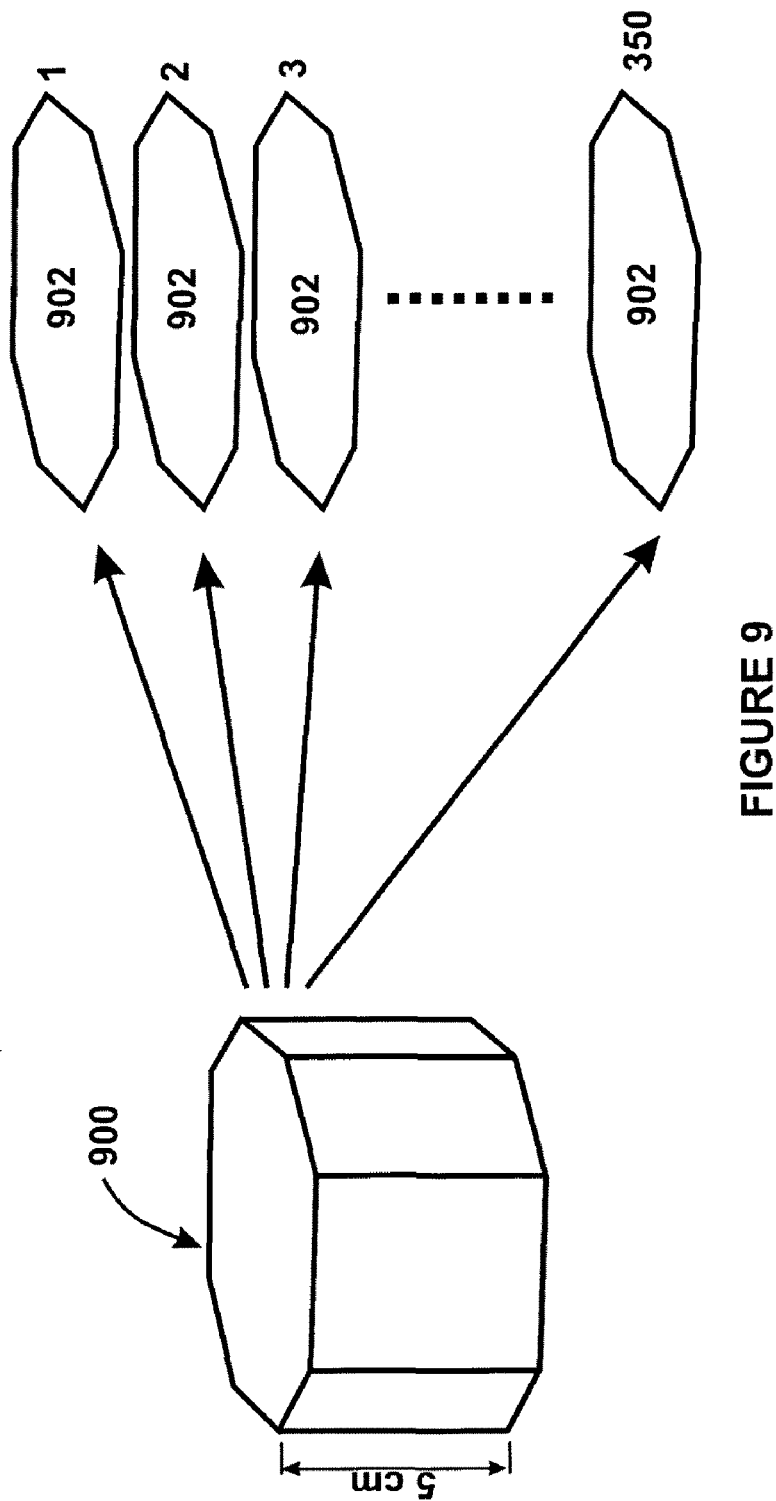
FIG. 9 shows a simplified schematic view of the formation of a plurality of free standing films of semiconductor material in accordance with an embodiment of the present invention.

FIG. 9 shows a simplified schematic view of the formation of a plurality of free standing layers of semiconductor material in accordance with one embodiment of the present invention. Single crystal silicon ingot 900 exhibits an original thickness of 5 cm and has lateral dimensions of 15 cm×15 cm. As the density of single crystal silicon is about 2.32 g/cm$^3$, the weight of this bulk single crystal silicon material is 15×15× 5×2.32=2.61 Kg Thus, cleavage of about 70% of the thickness of ingot 900 utilizing techniques according to embodiments of the present invention, produces 350 free standing single crystal silicon films 902, each having a thickness of 100 um. As 1 m represents about 45 tile surfaces having an area of 15 cm×15 cm, a total silicon surface area of about 7.8 m$^2$ can be produced from 70% of a 5 cm thick ingot. The remaining 30% of the ingot not cleaved to form single crystal silicon, can be returned to the melt as highly purified starting material to produce a fresh ingot for cleaving. The remaining material is therefore not to be regarded as part of a kerf loss or lost material but rather the recyclable mechanical remnant of the ingot material.

Figure 10:
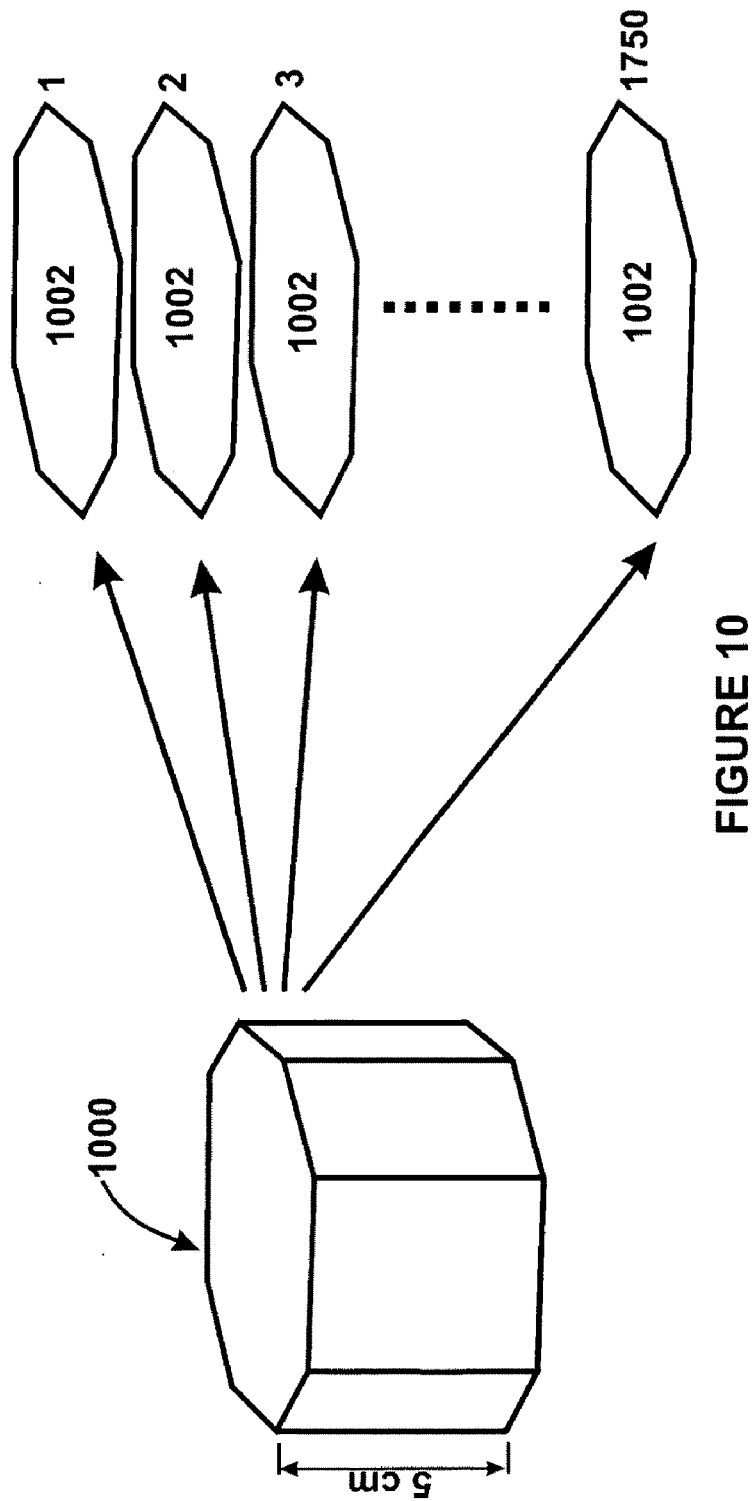
FIG. 10 shows a simplified schematic view of the formation of a plurality of free standing films of semiconductor material in accordance with another embodiment of the present invention.

FIG. 10 shows a simplified schematic view of the formation of a plurality of free standing layers of semiconductor material in accordance with another embodiment of the present invention. As shown in the embodiment of FIG. 10, single crystal silicon ingot 1000 exhibits an original thickness of 15 cm and has lateral dimensions of 15 cm×15 cm. Cleavage of about 70% of the thickness of ingot 1000 utilizing techniques according to the present invention, produces 1750 free standing single crystal silicon films 1002 having a thickness of 20 um. As 1 $m^2$ represents about 45 tile surfaces each having an area of 15 cm×15 cm, in this embodiment about 39 $m^2$ of silicon can be produced from 70% of a 5 cm thick ingot.

Experimental Data

The efficiency of the separation method in accordance with embodiments of the present invention is evidenced by the following experimental results. In one experiment, a bulk material weighing 14.2 grams comprising float-zone single-crystal silicon of (111) orientation, with Phosphorous N-type doping of >25 ohm-cm, having a diameter of about 25 mm and a thickness of about 12.5 mm, was subjected to 3 consecutive cycles of slicing under conditions detailed in the following TABLE:

TABLE

| PROCESS STEP | PROCESS PARAMETERS |
| --- | --- |
| first implant | implanted species: Hydrogen<br>temperature: Estimated to be less than 100 C.<br>dose: 1E16 H+/$cm^2$<br>dose rate: 7.6E12 H+/$cm^2$-sec energy: 3.5 MeV<br>ion source: ECR plasma/RFQ Linac |
| second implant | implanted species: Hydrogen<br>temperature: Estimated to be less than 100 C. but higher than first implant dose: 7E16 H+/$cm^2$ (first cleave), 8E16 H+/$cm^2$ (second/third cleave)<br>dose rate: 1.52E13 H+/$cm^2$-sec<br>energy: 3.5 MeV<br>ion source: ECR plasma/RFQ Linac |
| post-implant treatment | 650 C., 60 minutes |

After 3 cycles, 3 free standing layers of silicon having a thickness of roughly 120 um were successively separated from the bulk material, leaving a residual bulk material with 12.14 mm remaining. To calculate bulk material efficiency, an implant damage layer etch of 5 um per side (10 um total) is assumed to remove the implant straggle, yielding an effective free-standing layer of 110 um. Thus, a thickness of material of 360 um was consumed to produce 3 wafers having a total usable thickness of material of 340 um. this translates to an efficiency of use of bulk material of about 94.4%, where efficiency=(total wt. of free standing layers)/(wt. of bulk material consumed)×100 or (0.386 grams/0.409 grams)× 100%. This is substantially greater than the efficiencies of 50% that would be expected from conventional blade sawing or wire sawing techniques.

Certain benefits may achieved over conventional techniques for separating free standing layers from bulk materials using embodiments of the present invention. For example, particular embodiments may use a cost effective linear accelerator device to provide high energy implantation. Such a linear accelerator device may include, but is not limited to, a drift tube technique, a Radio Frequency Quadrupole, commonly called RFQ, or combinations of these, (for example, a RFQ combined with a Drift Tube Linac or a RFI (RF-Focused Interdigital) Linear Accelerator), and other suitable techniques. In a preferred embodiment, the linear accelerator provides an implantation process that forms a thickness of free standing material defined by a cleave plane in a bulk material.

The thickness of the free standing material may be further processed to provide a high quality semiconductor material for application such as photovoltaic devices, 3D MEMS or integrated circuits, IC packaging, semiconductor devices, any combination of these, and others. One embodiment of the present method provides for single crystal silicon for highly efficient photovoltaic cells among others. Certain embodiments use a low initial dose of energetic particles, which allows the process to be cost effective and efficient.

Certain embodiments in accordance with the present invention allow for fabrication of large area substrates. For example, embodiments of the present invention can be applied to make thin silicon material plates of the desired form factor (for example, 50 μm-200 μm thickness with a area size from 15 cm×15 cm to upwards of 1 m×1 m or more for polysilicon plates).

In accordance with an alternative embodiment of the present invention, a seed layer may further provide for layering of a hetero-structure epitaxial process. The hetero-structure epitaxial process can be used to form thin multi-junction photovoltaic cells, among others. Merely as an example, GaAs and GaInP layers may be deposited heteroepitaxially onto a germanium seed layer, which is a free standing layer formed using an implant process according to an embodiment of the present invention.

Embodiments of the present invention relate generally to techniques including an apparatus and a method of introducing charged particles for semiconductor material processing. More particularly, the present apparatus and method provide a system using radio frequency quadrupole linear accelerator to obtain a beam of particles with MeV energy level for manufacturing one or more detachable semiconductor film that is capable of free-standing for device applications including photovoltaic cells. But it will be recognized that the invention has a wider range of applicability; it can also be applied to other types of applications such as for three-dimensional packaging of integrated semiconductor devices, photonic or optoelectronic devices, piezoelectronic devices, flat panel displays, microelectromechanical systems ("MEMS"), nanotechnology structures, sensors, actuators, integrated circuits, biological and biomedical devices, and the like.

Figure 11:
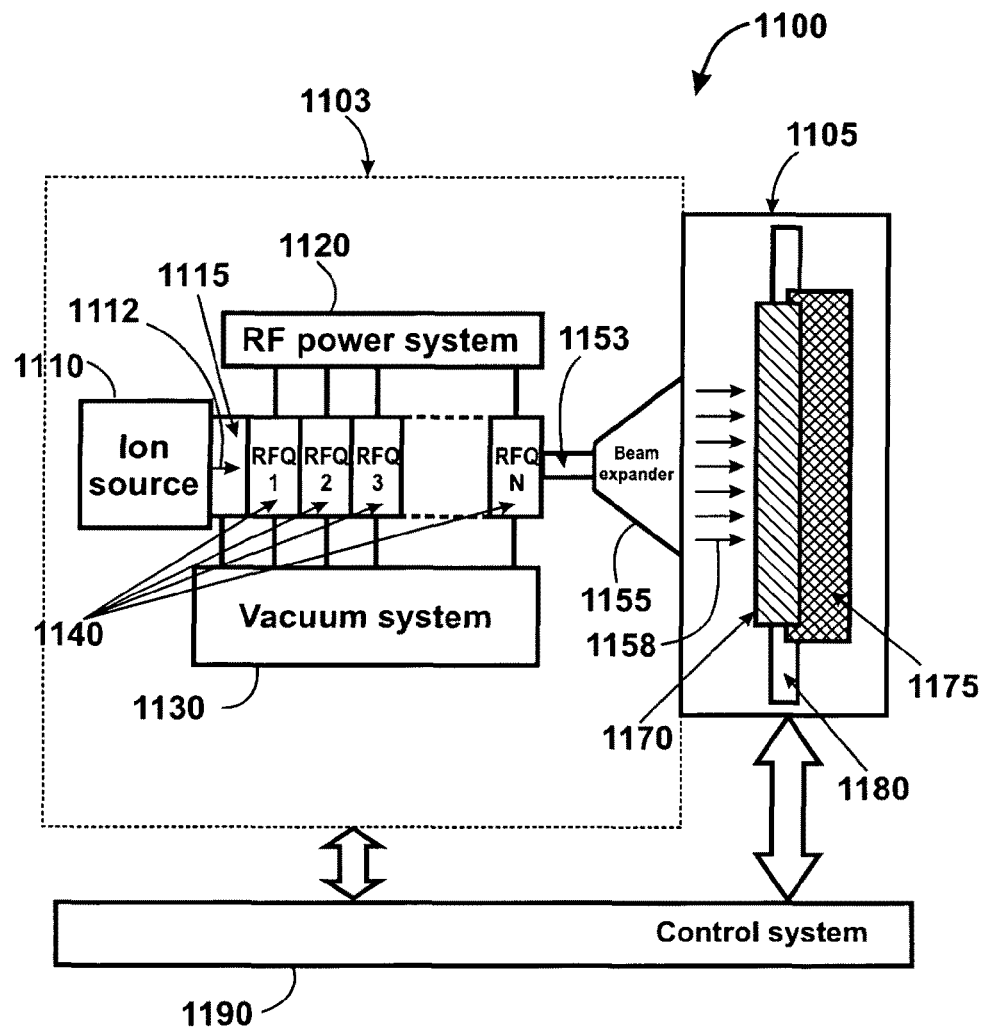
FIG. 11 is a simplified diagram illustrating an apparatus for introducing a charged particle beam for making a detachable free-standing film of semiconductor materials according to an embodiment of the present invention.

FIG. 11 is a simplified diagram illustrating an apparatus for introducing charged particles for manufacture of a detachable free-standing film of semiconductor materials for device applications according to an embodiment of the present invention. This diagram is merely an example, which should not unduly limit the scope of the claims recited herein. One of ordinary skill in the art would recognize many variations, modification, and alternatives. As shown, the apparatus 1 introducing charged particles for manufacture of one or more detachable semiconductor films capable of being free-standing for device applications. More specifically, the apparatus 1100 includes two systems, system 1103 as a charged particle beam generation system and system 1105 as a beam application system. System 1103 includes the following components: an ion source 1110, low energy beam transport unit 1115 to capture and guide an initial particle beam 1112 at a first energy level, a plurality of modular radio frequency quadrupole elements 1140, RF power system 1120, vacuum system 1130, high energy beam transport unit 1153 and a beam expander 1155. System 1105 is a process chamber coupled to the beam expander 1155, where the charged particle beam 1158 at the second energy level with expanded beam diameter is applied. System 1105 further includes a workpiece 1170, a tray device 1175, a 2-axis moving stage. In addition, both system 1103 and 1105 are linked to a computer system 1190 which provides operation and process controls.

In a specific embodiment, apparatus 1100 includes an ion source 1110 to generate a plurality of charged particles. The ion source can be generated by electron cyclotron resonance (ECR), inductively coupled plasma, plasma based magnetron ion source, or a penning source or others, depending upon the embodiment. One of ordinary skill in the art would recognize many other variations, modifications, and alternatives. In a preferred embodiment, the plurality of charged particles are collimated as a first beam 1112 provided at a first energy level.

Referring again to FIG. 11, first beam 1112 at the first energy level is guided by a low energy beam transport (LEBT) unit 1115 into a linear accelerator subsystem. The linear accelerator subsystem includes a plurality of modular radio frequency quadrupole (RFQ) elements 1140 numbered from 1 through N successively coupled to each other. For example, the LEBT unit is based on a single articulated Einzel lens containing an electrode mounted on a three-axis stage which can be used to guide first beam 1112 into an RFQ aperture. The transverse motions are used to guide first beam 1112 into RFQ elements 1140. A lens voltage and a longitudinal motion can be used to optimize first beam 1112 at the first energy level within the plurality of RFQ elements 1140. In other embodiments, the use of magnetic confinement, such as through multiple solenoids, could also provide beam shaping and extraction of charged particles in to the Linac (RF) elements.

In an specific embodiment, the plurality of modular RFQ elements 1140 can be used to bunch, focus, and accelerate the first beam of charged particles at the first energy level to a second beam at a second energy level. Particularly, each of the plurality of modular RFQ elements 1140 is configured to be a RF resonant cavity in a RF cylindrical structure operating at a resonant frequency of 200 MHz. The RF cylindrical structure can include a quadrupole electrode capable of confining or transversely focusing an high energy charged particles. In one example, the quadrupole electrode is configured to manage the electric field distribution within the cavity. These could be in form of vanes or strut holding configurations. The quadrupole electrode can be configures to manage the distribution of the charged particles within the beam so that the particles are exposed to the electric fields when they are in the accelerating direction and shielded from them when they are in the decelerating direction. The net effect of the RF electric field therein is an acceleration effect for first beam 1112. In an alternate embodiment, RFQ elements 1140, or specifically, the RFQ elements numbered 1102 through N may combine the RF quadrupole with a drift-tube technique. Alternatively, other Linac configurations such as RFI or QFI could be employed. The first beam can be accelerated through the plurality of modular RFQ elements 1140 to a beam at the second energy level. In a specific embodiment, the second energy level can be in a range of 1 MeV to 5 MeV at an exit aperture on the RFQ element numbered N.

Referring back to FIG. 11, the plurality of modular RFQ elements 1140 are powered by a RF power system 1120 capable of supplying a continuous wave (CW) output of at least 50 kW and/or a pulsed output of 150 kW at about 30% duty. For example, RF power system 1120 may be rated for operation as high as 1000 MHz and have an anode power rating of at least 2.5 kW. Other embodiments may use Triodes, Tetrodes, Klystrodes, Inductively output tubes (IOT), or coaxial IOTs (C-IOT) to provide such RF power conversions.

The RF power system and each of the plurality of modular RFQ elements are coupled to a cooling system (not shown) to prevent the system from overheating. For example, the cooling system may include a plurality of parallel cooling circuits using water or other cooling fluid. In another embodiment, the low energy beam transport unit and each of the plurality of modular RFQ elements are provided in a high vacuum environment 1130. For example, a vacuum of less than $5 \times 10^{-7}$ Torr range may be provided using at least one or more 400 liter per second turbomolecular vacuum pumps. Of course there can be other variations, modifications, and alternatives.

As shown in FIG. 11, particle generation system 1103 further includes a high energy beam transport (HEBT) unit 1153 at the exit aperture of the RFQ element numbered N to capture and guide the beam into a beam expander 1155. For example, the beam expander can use a magnetic field managed through a plurality of magnets in quadrupoles, sextupoles, octupoles and/or higher multipoles configuration to uniformly re-distribute a charged particle beam to one with a larger diameter. The beam expansion can also occur through drift of the beam over a distance where the beam will naturally expand to the desired beam diameter and beam flux spatial distribution. The beam expansion can also occur through drift of the beam over a distance where the beam will naturally expand to the desired beam diameter and beam flux spatial distribution. Using the beam expander, the charged particle beam 1158 at the second energy level can have a beam diameter up to 500 mm on a substrate. The expanded beam diameter reduces a power flux of high energy particles to prevent overheating of the substrate. The expanded beam also prevents face damage of the substrate. Additionally, an optimized dose rate of an ion into a substrate can be provided by at least beam diameter adjustment and beam current control. For example, the total current of the expanded charged ion beam can be 30 mA and higher. With a 500 mm beam diameter the power flux can be controlled to under 50 W/cm$^2$, a power flux low enough that slow scanning (or even no scanning) of the expanded beam can occur without surface overheating. Alternatively, a smaller beam diameter such as 5 cm can be used, which may be useful for generating patterned implant dose profiles within each tile. For such a smaller beam, the power flux can be as high as 5-10 kw/cm$^2$, and can require magnetic or electrostatic fast scanning to avoid surface overheating.

In another embodiment, the output port of the beam expander is directly coupled to the beam application system where the expanded beam of charged particles can be used for implantation into, for example, into a semiconductor substrate. The implanted semiconductor substrate may be further processed to form one or more films (for example free standing thick films) to be used in application such photovoltaic cell. Furthermore the HEBT could contain magnetic or electrical mass analysis to provide the required species only in to the substrate. This will allow for some beam shaping as well changing the direction of the beam to improve the packaging of the total system.

In one embodiment, system 1105, which is operably coupled to the beam expander, can be a process chamber capable of receiving the high energy beam of charged particles. In a specific embodiment, the high energy beam of charged particles may be provided at MeV level using the expanded beam. For example, workpiece 1170, which can be one or more tile-shaped semiconductor materials, can be mounted on a tray device 1175 and be exposed to the high energy beam of charged particles. In a specific embodiment, in such that the workpiece can be arranged substantially perpendicular to the direction of the high energy beam of charged particles. In another embodiment, the tray device may includes a two-axis stage 80 through which the tray device 1175 is capable of moving 2-dimensionally thereby allowing the high energy beam of charged particles to scan across the entire surface of the workpiece. In other embodiments a third dimension movement of the work pieces may also be necessary to improve the system performance. Of course there can be other variations, modifications, and alternatives.

Referring again to FIG. 11, a control system 1190 is coupled to the apparatus. The control system can be a computer system. The control system provides operation and processing controls respectively for both system 1103 and system 1105. For system 1103, ion source 1110 can be adjusted to provide a collimated charge particle beam with a desired current, for example, up to 30 mA. The RF power system 1120 can be operated in continuous wave (CW) mode or pulsed mode. The control system controls the RF power, including desired power level and matching frequency delivered into the linear accelerator, which is formed by the plurality of modular RFQ elements. For example, the RFQ elements can include RF quadrupole unit, drift tube, or a combination in CW mode. In CW mode, the total RF power dissipation in the RF quadrupole unit (or the RFQ element numbered 1) is at least 40 kW and the total RF power dissipation into the rest of RFQ elements (i.e., RFQ elements numbered from 2 to N) is at least 26 kW. The beam transport units are also controlled by the control system by adjusting the three-axis moving stage and lens voltage to provide an optimized beam capture. The control system is linked to the beam expander to a desired beam diameter and beam uniformity of an output beam. In a specific embodiment, the beam expander is controlled using a magnetic field. In an alternative embodiment, the control system 90 is coupled to the beam application system to provide processing control such as temperature measurement and workpiece control within the tray device. Of course there can be other variations, modifications, and alternatives.

In a specific embodiment, the apparatus according to embodiments of the present invention provides a charged particle beam at MeV energy level to provide for an implantation process. The implantation process introduces a plurality of impurity particles to a selected depth within a thickness of a semiconductor substrate to define a cleave region within the thickness. Depending upon the application, smaller mass particles are generally selected to reduce a possibility of damage to the material region according to a preferred embodiment. That is, smaller mass particles easily travel through the substrate material to the selected depth without substantially damaging the material region that the particles traverse through. For example, the smaller mass particles (or energetic particles) can be almost any charged (e.g., positive or negative) and or neutral atoms or molecules, or electrons, or the like. In a specific embodiment, the particles can be charged particles including ions such as ions of hydrogen and its isotopes, rare gas ions such as helium and its isotopes, and neon, or others depending upon the embodiment. The particles can also be derived from compounds such as gases, e.g., hydrogen gas, water vapor, methane, and hydrogen compounds, and other light atomic mass particles. Alternatively, the particles can be any combination of the above particles, and or ions and or molecular species and or atomic species. The particles generally have sufficient kinetic energy to penetrate through the surface to the selected depth underneath the surface.

Figure 12:
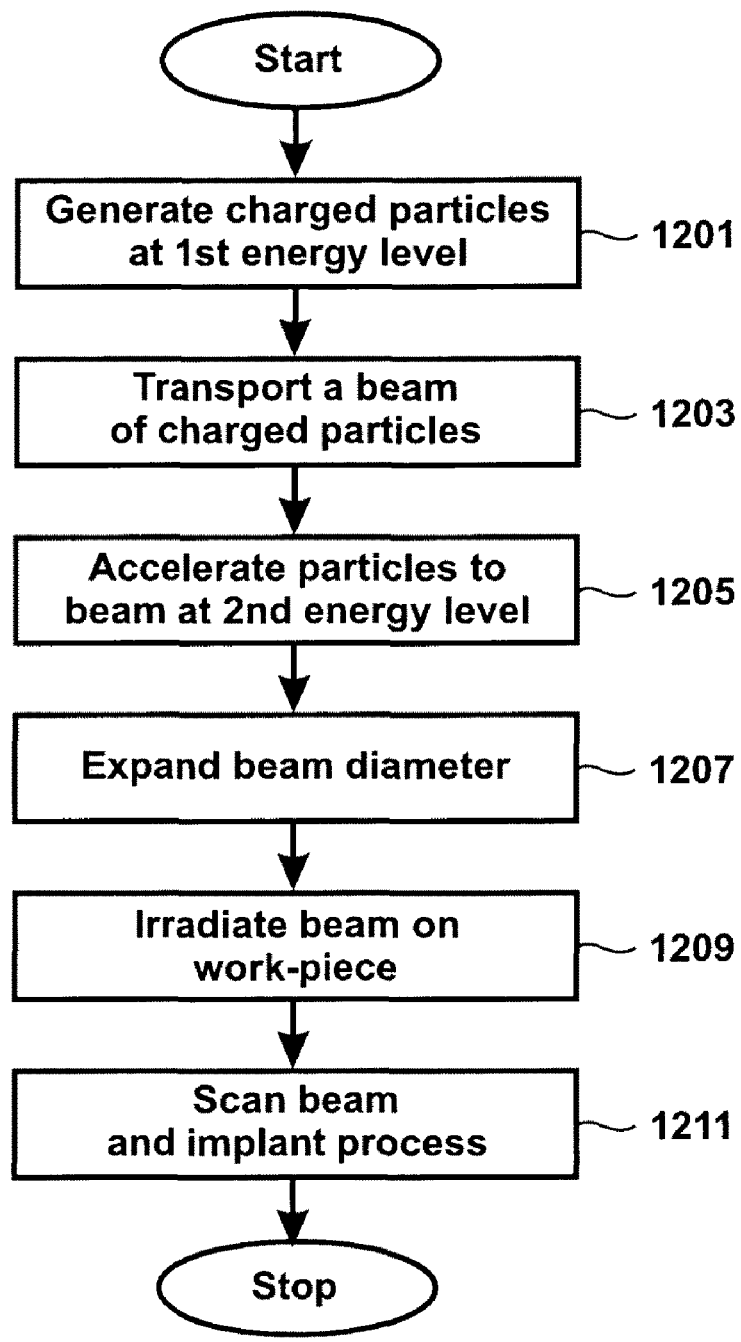
FIG. 12 is a simplified flow diagram illustrating a method of generating a plurality of high energy charged particles according to embodiments of present invention.

Referring now to the FIG. 12, which is a simplified diagram of a method to generate high energy charged particles according to an embodiment of the present invention. As show, the method 1200 includes a step of generating a plurality of charged particles at a first energy level (Step 1201). In a specific embodiment, the plurality of charged particles at the first energy may be provided using an ion source such as electron cyclotron resonance (ECR), inductively coupled plasma, plasma based magnetron ion source, or a penning source. The plurality of charged particles at a first energy level is guided in a low energy transport (LEBT) unit (Step 1203) into a liner accelerator. The liner accelerator accelerate the plurality of charged particles at a first energy level (Step 1205) to produce a plurality of charged particles at a second energy level. The second energy level is greater than the first energy level. The plurality of charged particles at the second energy level is subjected to a beam expander (Step 1207) to expand a beam diameter of the plurality of charged particles at the second energy level. The method irradiates the expanded beam onto a workpiece (Step 1209). In a specific embodiment, the workpiece can be semiconductor substrates tiles provided in a tray device. The expanded beam of the plurality of charged particles is scanned (Step 1211) and provide an implantation process for, for example, forming a substrate for photovoltaic application. Of course on skilled in the art would recognize many variations, modifications, and alternatives, where one or more steps may be added, one or more steps may be eliminated, or the steps may be provided in a different sequence.

Using hydrogen as the implanted species into the silicon wafer as an example, the implantation process is performed using a specific set of conditions. Implantation dose ranges from about $1\times10^{15}$ to about $1\times10^{16}$ atoms/cm$^2$, and preferably the dose is less than about $5\times10^{16}$ atoms/cm$^2$. Implantation energy ranges from about 1 MeV and greater to about 5 MeV and greater for the formation of thick films useful for photovoltaic applications. Implantation temperature ranges from about −50 to about 550 Degrees Celsius, and is preferably less than about 400 Degrees Celsius to prevent a possibility of hydrogen ions from diffusing out of the implanted silicon wafer. The hydrogen ions can be selectively introduced into the silicon wafer to the selected depth at an accuracy of about ±0.03 to ±1.5 microns. Of course, the type of ion used and process conditions depend upon the application.

As an example, MeV range implant conditions have been disclosed by Reutov et al. (V. F. Reutov and Sh. Sh. Ibragimov, "Method for Fabricating Thin Silicon Wafers", USSR's Inventors Certificate No. 1282757, Dec. 30, 1983), which is hereby incorporated by reference. In V. G. Reutov and Sh. Sh. Ibragimov, the use of up to 7 MeV proton implantation with optional heating during implant and post-implant reusable substrate heating was disclosed to yield detached silicon wafer thicknesses up to 350 um. A thermal cleaving of a 16 micron silicon film using a 1 MeV hydrogen implantation was also disclosed by M. K. Weldon & al., "On the Mechanism of Hydrogen-Induced Exfoliation of Silicon", J. Vac. Sci. Technol., B 15(4), July/August 1997, which is hereby incorporated by reference. The terms "detached" or "transferred silicon thickness" in this context mean that the silicon film thickness formed by the implanted ion range can be released to a free standing state or released to a permanent substrate or a temporary substrate for eventual use as a free standing substrate, or eventually mounted onto a permanent substrate. In a preferred embodiment, the silicon material is sufficiently thick and is free from a handle substrate, which acts as a supporting member. Of course, the particular process for handling and processing of the film will depend on the specific process and application.

Figure 13:
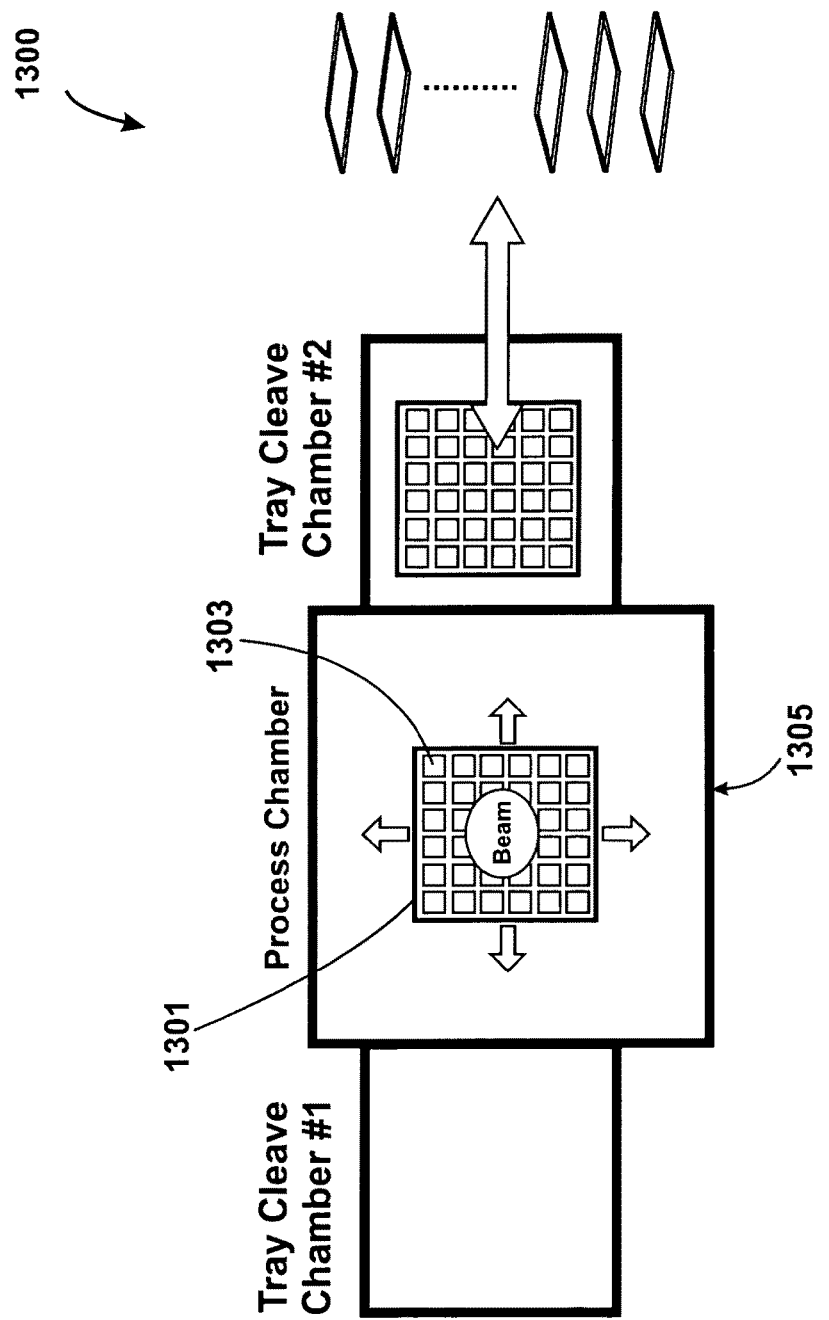
FIG. 13 is a simplified diagram illustrating a top view diagram of forming detachable thick film from a substrates according to an embodiment of the present invention.
Figure 14:
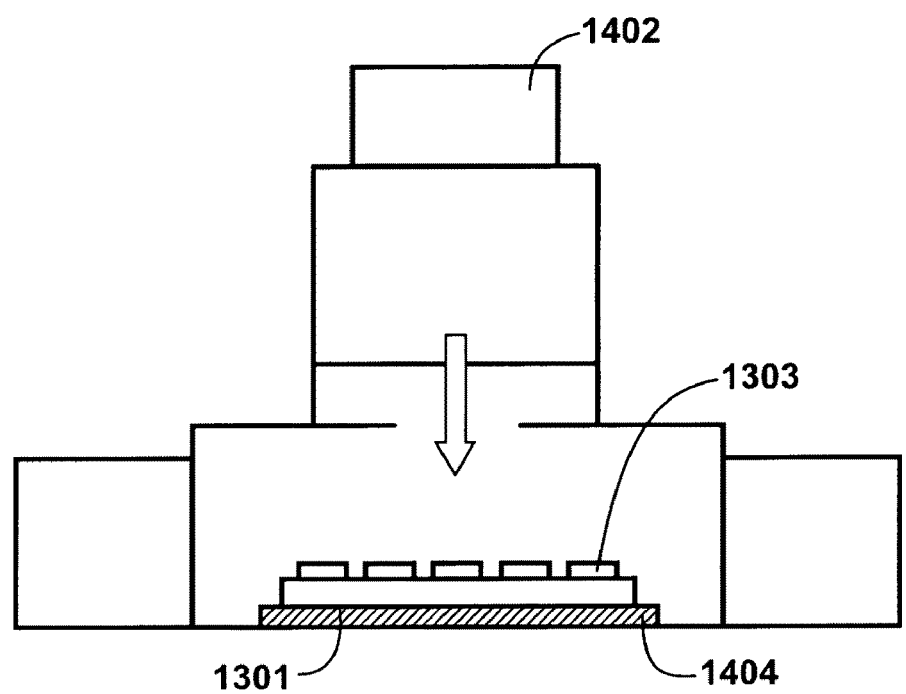
FIG. 14 is a simplified diagram illustrating a method of implanting charged particles into a semiconductor material according to an embodiment of the present invention.

FIG. 13 is a simplified diagram illustrating a system 1300 for forming substrates using a continuous process according to an embodiment of the present invention. This diagram is merely an example and should not unduly limit the scope of the claims herein. One of ordinary skill in the art would recognize other variations, modifications, and alternatives. As shown in FIG. 13, the system includes providing at least one substrate members 1301. Each of the substrate members includes a plurality of tiles 1303 disposed thereon. Each of the plurality of sites includes a reusable substrate member 1303 to be implanted. In a specific embodiment, each of the plurality of tiles may include semiconductor substrate such as single crystal silicon wafers, polysilicon cast wafer, tile, or substrate, silicon germanium wafer, germanium wafer, group III/V materials, group II/VI materials gallium nitride or the like. Any of the single-crystal material can be cut to specific orientations that offer advantages such as ease of cleaving, preferred device operation or the like. For example, silicon solar cells can be cut to have predominantly (100), (110), or (111) surface orientation to yield free-standing substrate of this type. Of course, starting material having orientation faces which are intentionally miscut from the major crystal orientation can be also prepared. The system also includes an implant device (not shown). The implant device is housed in a process chamber 1305. In a specific embodiment, the implant device provides a scanning implant process. Such implanting device can use an expanded high energy ion beam generated in a linear accelerator in a specific embodiment. As shown in FIG. 14, the implanting device includes an ion implant head 1402 to provide for impurities to be implanted in the plurality of tiles. The system also includes a movable track member 1404. The movable track member can include rollers, air bearing, or a movable track in certain embodiments. Movable track member 1404 provides a spatial movement of the substrate member for the scanning implant process. Of course there can be other variations, modifications, and alternatives.

Figure 17:
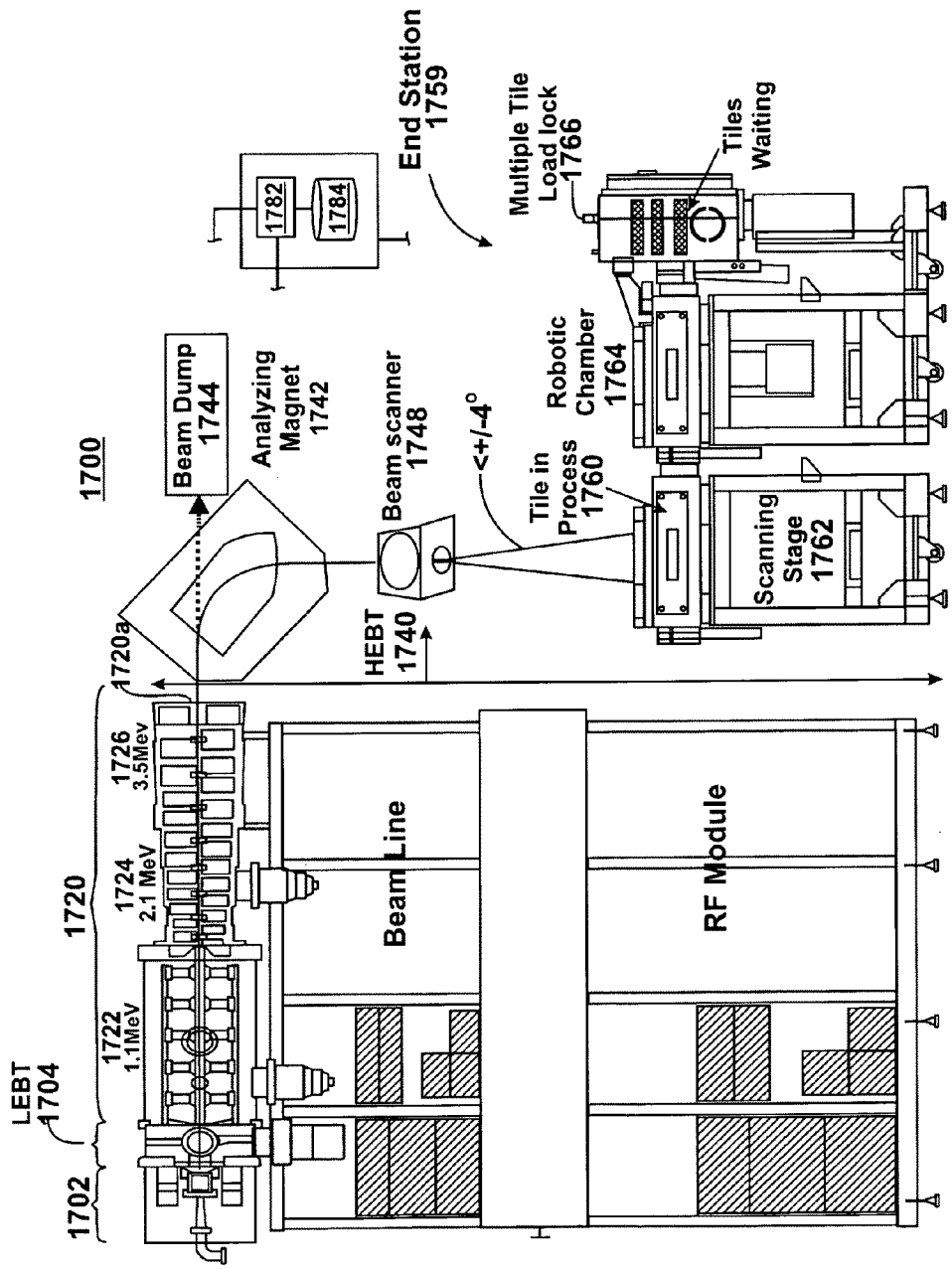
FIG. 17 is a simplified schematic diagram illustrating components of an embodiment of an apparatus for performing implantation according to the present invention.
Figure 17A:
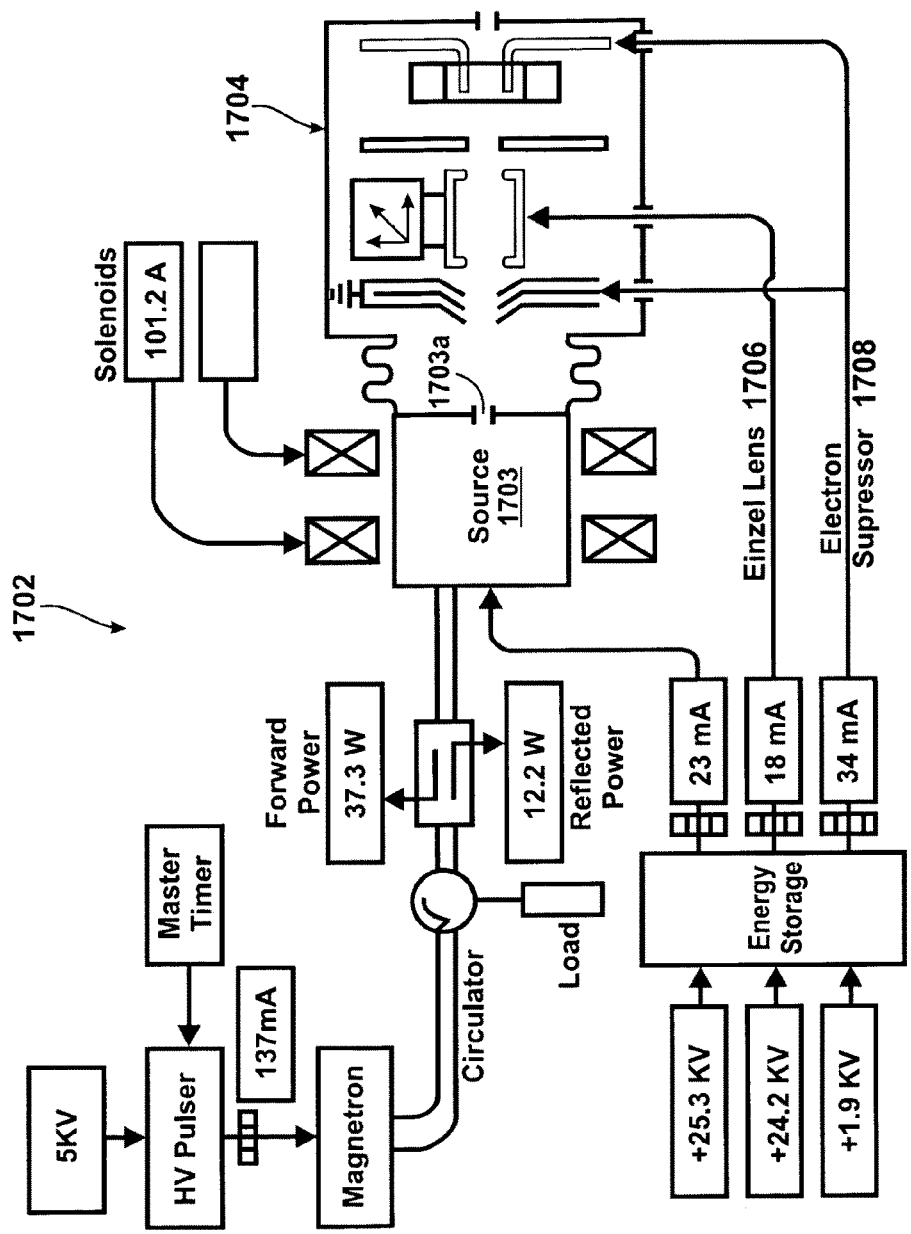
FIG. 17A shows an enlarged schematic view of the ion source and low energy beam transport section of the apparatus of FIG. 17.

Certain embodiments in accordance with the present invention may employ a scanning mode for implantation. An example of such an embodiment is shown in the simplified schematic views of FIGS. 17-17C. In particular, FIG. 17 is a simplified schematic diagram illustrating components of an embodiment of an apparatus for performing implantation according to the present invention. FIG. 17A shows an enlarged schematic view of the ion source and low energy beam transport section of the apparatus of FIG. 17.

Apparatus 1700 comprises ion source 1702 in vacuum communication with Low Energy Beam Transport (LEBT) section 1704. LEBT 1704 can contain elements for electrical and or magnetic beam extraction, shaping and focusing. The LEBT section 1704 performs at least the following functions.

Referring to FIG. 17A, the LEBT takes the ions that stream out of the aperture 1703a in the ion source chamber 1703, and accelerates these ions to a relatively low energy (100 keV or less, and here ~30 keV). This acceleration of the ions achieves the resonance velocity necessary to couple to the first, Radio Frequency Quadrupole (RFQ) stage 1722 of the succeeding linear accelerator (linac) section 1720. Alternatively this can be achieved through the use of multiple solenoids that magnetically can extract, shape and focus the beam.

Examples of ion sources include ECR, microwave ion sources, magnetron ion sources, and Penning sources. Examples of ionization methods include the use of e-beams, lasers, hot and cold cathode discharges, and thermal techniques.

The LEBT 1704 also typically functions to shape the ion beam for optimum acceptance into the first, RFP stage 1722 of the linac section 1720. In this particular embodiment, the beam shaping element is an Einzel lens 1706. In accordance with alternative embodiments, however, other LEBT lenses using different designs such as solenoid (magnetic field lensing), could be used.

The LEBT 1704 also includes an electron suppressor element 1708. This element 1708 serves to suppress secondary electrons generated by errant ions interacting with exposed surfaces of the LEBT.

Figure 17B:
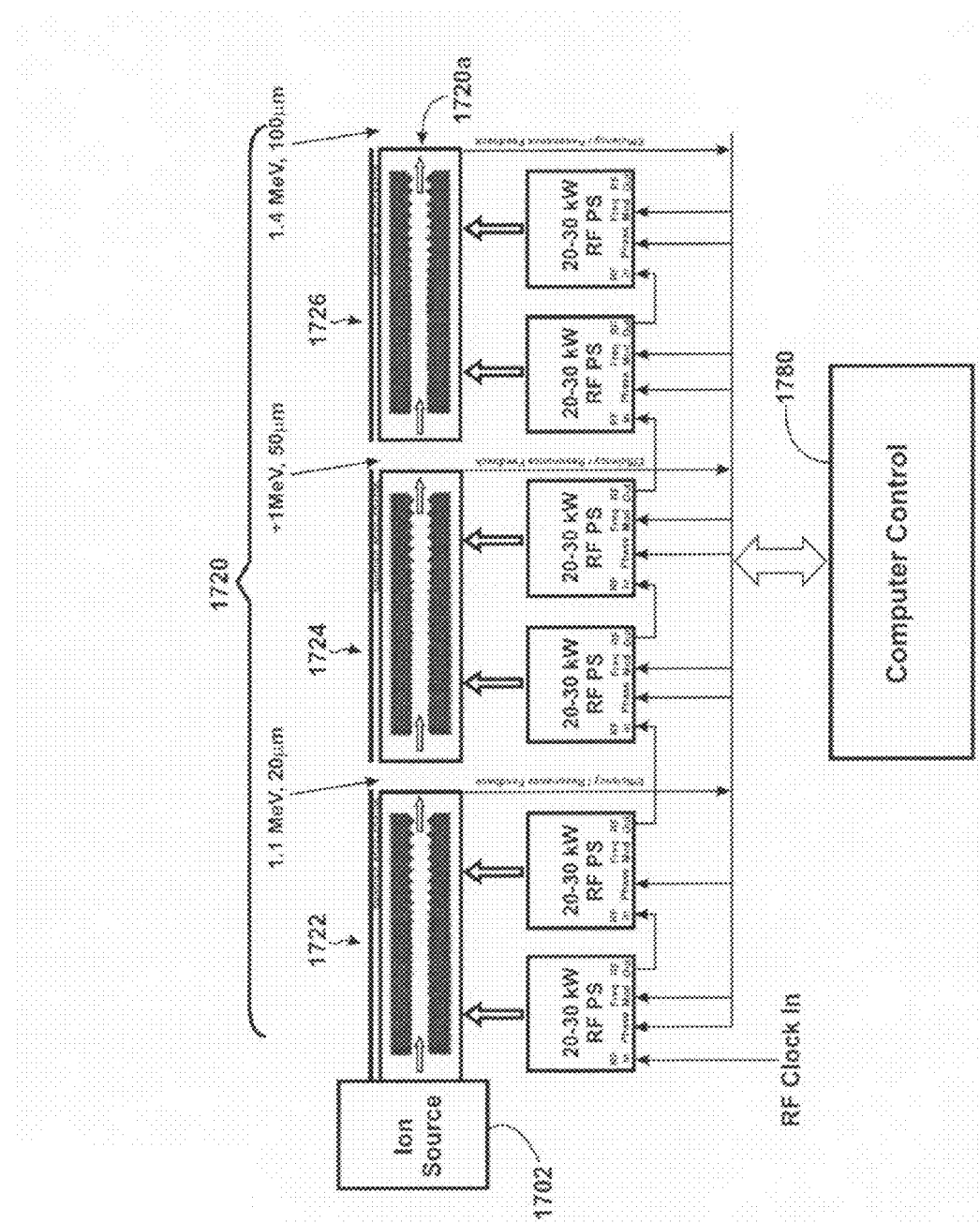
FIG. 17B shows an enlarged schematic view of the linear accelerator of the apparatus of FIG. 17.

Upon entry into the linac section 1720, the ion beam is accelerated to higher and higher energies by successive stages. FIG. 17B shows a simplified schematic view of the linear accelerator section 1720.

In the first, RFQ stage 1722, the ions are accelerated from the energy of ~30 keV, to an energy of about 1.1 MeV. In a second linac stage 1724, the ions are accelerated to about 2.1 MeV. In the third and final linac stage 1726, the ions are accelerated to energies of about 3.5 MeV or even greater.

The ion beam presented by the LEBT to the entrance of the first accelerator 1722, is continuous during the source pulse. However, via the alternating acceleration/focusing mechanisms of the RF accelerators 720, this continuous beam is transformed into packets or bunches temporally spaced one RF period apart, as they are accelerated down these Linacs.

FIG. 7B shows the typical level RF amplifier, feedback controls, and RF connections to the Linac stages. A single or multiple RF inputs couple one or more combinations of RFQ and RFI Linacs.

During operation, the reflected powers from the RFQ and RFI cavities are monitored. In the closed feedback loop, the RF frequency is adjusted to minimize the reflected power by maintaining resonances simultaneously in all the cavities.

The combination of RFQ and RFI may be chosen to maximize efficiency of the system. Specifically, since the efficiency of the RFQ technology decreases with proton energies above ~0.75 MeV, the RFI Linac (which is more efficient than RFQ) is used in subsequent acceleration stages to achieve the final beam energies.

Upon exiting the linac section 1720, the ion beam enters the High Energy Beam Transport (HEBT) section 1740. The function of the HEBT section 1740 is to bend the path of the highly energetic ion beam, to achieve scanning of the beam on the target (if appropriate), and also to shape the highly energetic ion beam exiting from the final linac stage 1726 (e.g. from elliptical to circular).

The beam travels through a set of diagnostic elements and enter a dipole magnet for mass analysis. At this point, the magnetic field is arranged so that the charged particles will be momentum analyzed.

Specifically, the highly energized ion beam is first optionally exposed to analyzing magnet 1742, which alters the direction of the beam and performs the cleansing function described throughout the instant application, such that initial contaminants of the high energy beam are routed to beam dump 1744.

In accordance with certain embodiments, the analyzing magnet 1742 exerts a force over the beam that is consistent over time, such that the resulting direction of the cleansed beam does not vary. In accordance with alternative embodiments, however, the analyzing magnet may exert a force over the beam that does change over time, such that the direction of the beam does in fact vary. As described in detail below, such a change in beam direction accomplished by the analyzing magnet, may serve to accomplish the desired scanning of the beam along one axis.

Figure 17C:
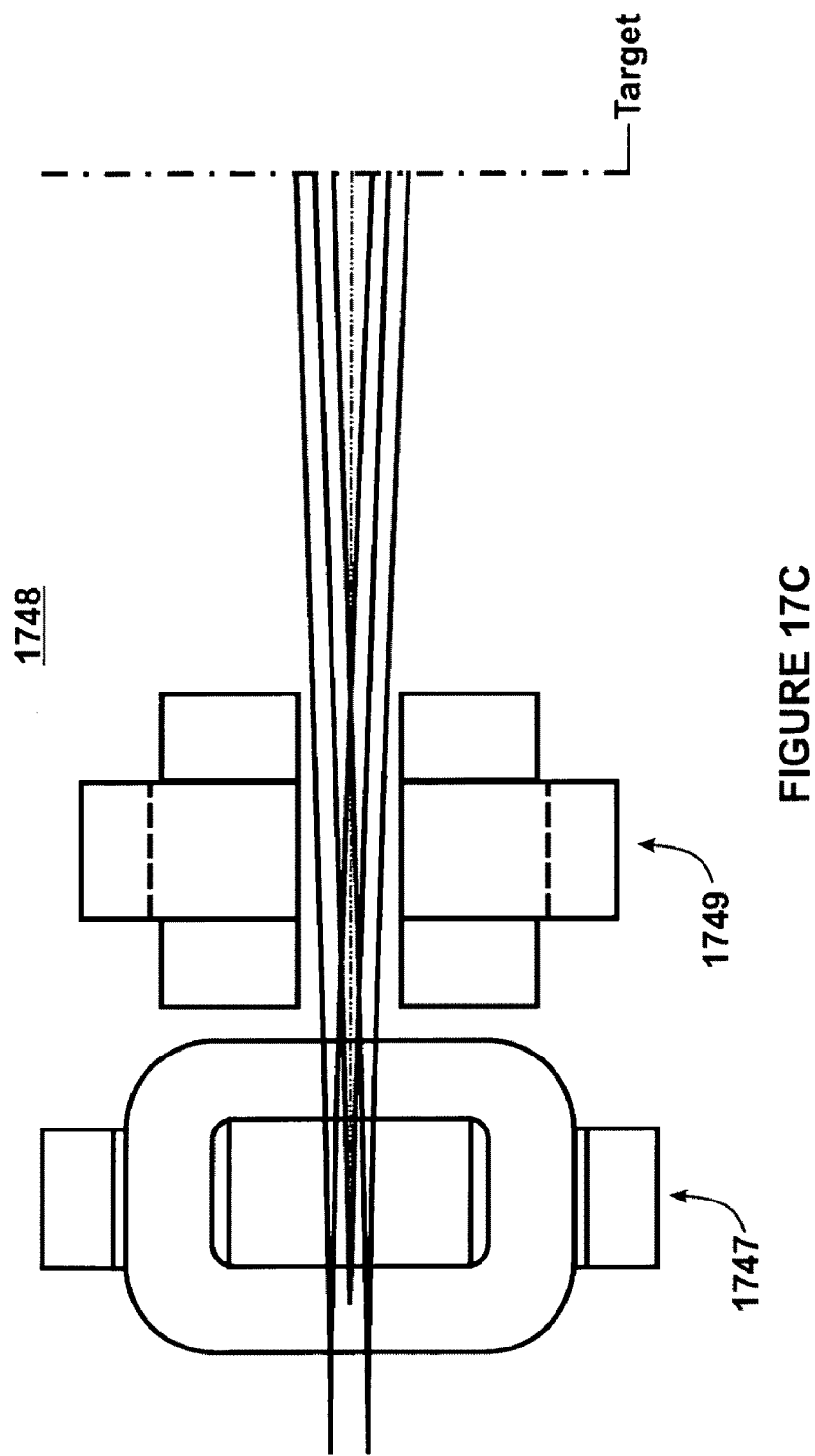
FIG. 17C shows an enlarged schematic view of the scanning device of the apparatus of FIG. 17.

After this analyzing magnet element, the beam may be further focused, and the beam can then be scanned using various methods to both provide a DC offset and/or AC varying beam. For example, in the embodiment of FIG. 17, upon exiting the analyzing magnet, the cleansed ion beam enters beam scanner 1748. FIG. 17C shows a simplified schematic diagram of one embodiment of the beam scanner 1748 in accordance with the present invention. Specifically, beam scanner 1748 comprises a first scanner dipole 1747 configured to scan to vary the location of the beam in a first plane. Beam scanner 1748 also comprises a second scanner dipole 1749 configured to scan to vary the location of the beam in a second plane perpendicular to the first plane.

Final beam shaping and focusing may be carried out using various combination of quadrupole and Sextupole etc magnetic focusing, where magnetic field is arranged in a manner to confer upon the beam a desired profile (i.e. Gaussian, top-hat etc.)

A sophisticated control system can be utilized for achieving whole area scan coverage, or for providing patterned coverage (i.e. lines or spots only). The control system may provide for lesser or greater dosages by controlling a dwell time of the beam, and/or by regulating the number of times the beam is scanned over the same location. Throughout the HEBT, the beam may be allowed to expand by allowing a dedicated drift portion.

Figure 17D:
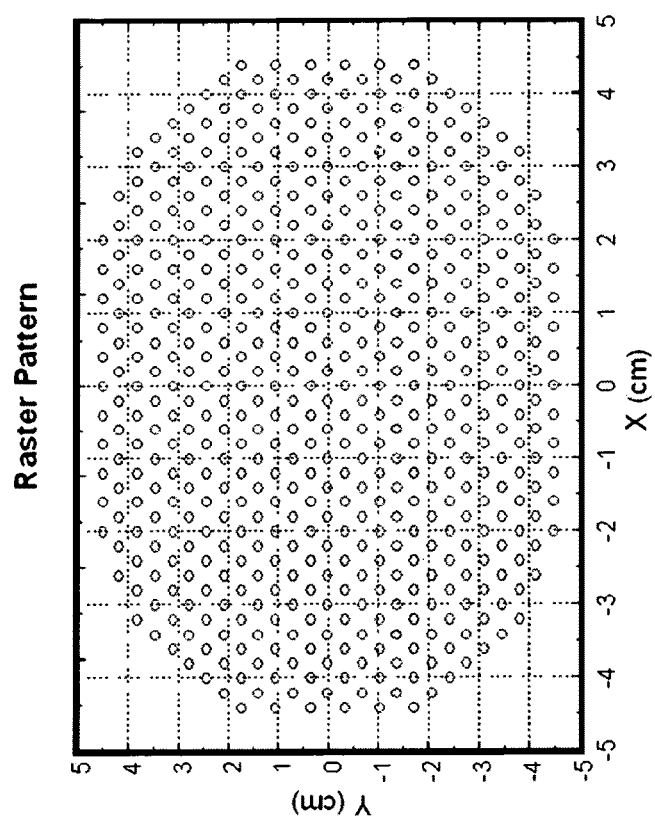
FIGS. 17D-G show various plots of simulated scanning of a high energy ion beam over a surface of a workpiece according to an embodiment of the present invention.
Figure 17E:
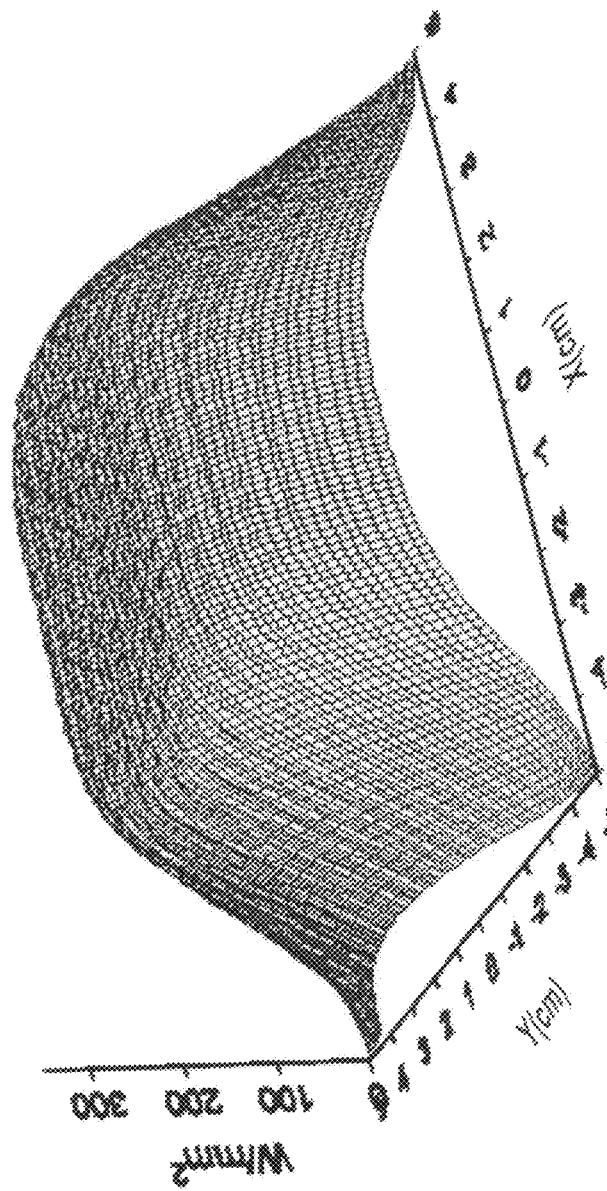
Figure 17F:
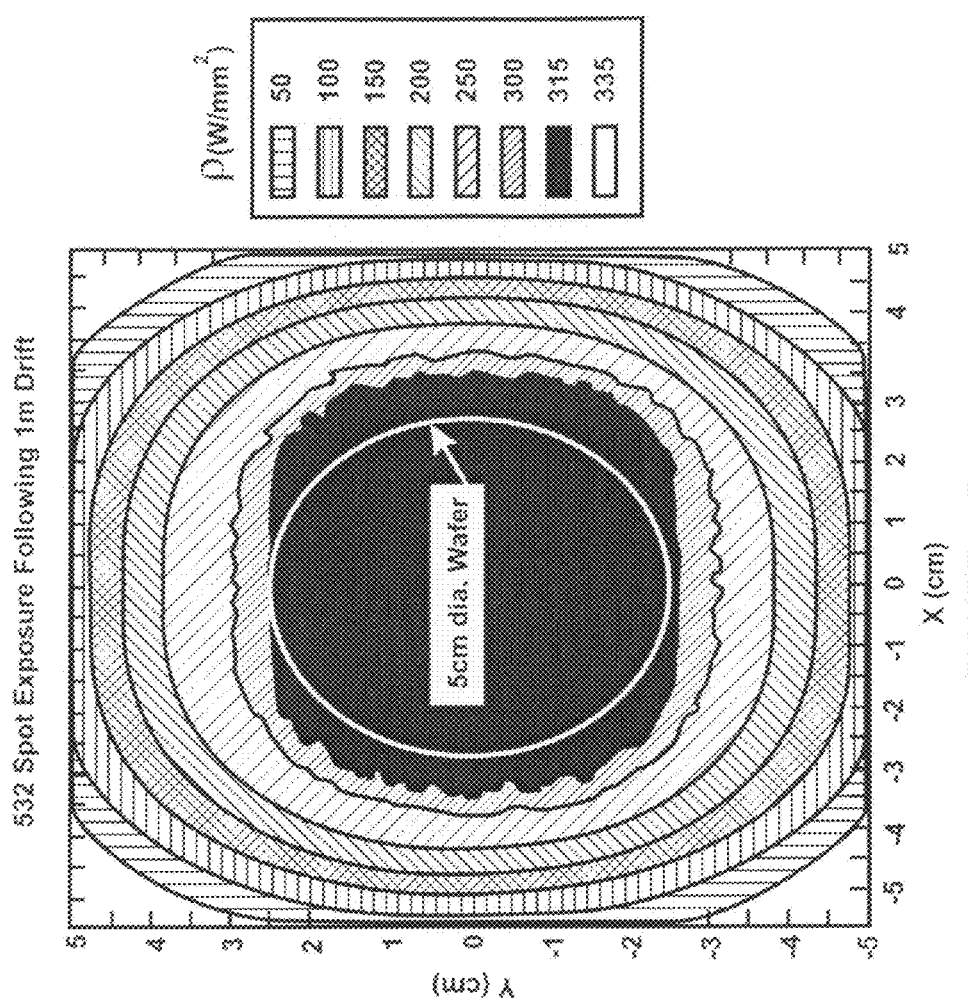

FIGS. 17D-G show simulated results of scanning an high energy beam of ions over a workpiece according to an embodiment of the present invention. Specifically, FIG. 17D shows a raster pattern of 532 spot exposure. FIG. 17E plots in three dimensions the power density of the 532 spot exposure of FIG. 17D. FIG. 17E plots in two dimensions the power density of the 532 spot exposure of FIG. 17D.

Figure 17G:
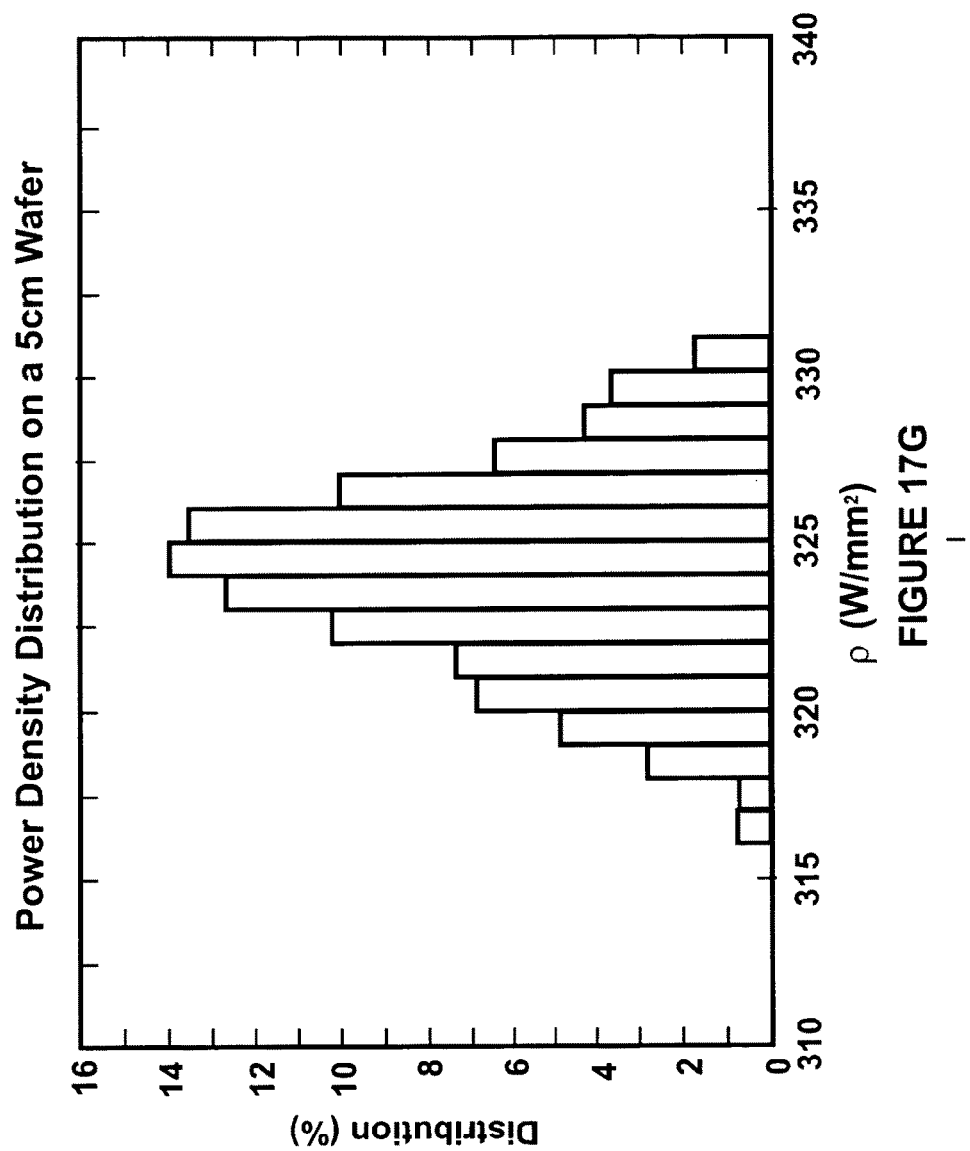

FIG. 17G is a bar graph of the power density versus distribution on a 5 cm wafer. the following 1 m drift. Taken together, these figures indicate that it is possible to irradiate a 5 cm diameter workpiece with a proton density of 3E 16/sq-cm with a power density uniformity of less than <5%.

While the particular embodiment of the beam scanner shown in FIG. 17C includes two dipoles, this is not required by the present invention. In accordance with alternative embodiments, the beam scanner could include only a single dipole. Specifically, in accordance with certain embodiments, the analyzer magnet located upstream of the beam scanner, could be utilized to provide scanning in a plane perpendicular to that in which scanning is achieved by a single dipole of the beam scanner. In one such embodiment, time-variance in the magnetic field of the analyzer magnet may result in an energized beam whose direction varies by +/−4° from the normal. Such "wobble" in the direction of the cleansed beam exiting the analyzing magnet, may be utilized for scanning in place of a second dipole of the beam scanner. Alternatively, such a wobbled beam may be used in conjunction with a beam scanner also having a second dipole, such that magnitude of scanning in the direction of the wobble is increased. Such beam scanners can be used for moving the beam by a DC shift, and then allow the wobbling to occur.

Throughout the HEBT, the beam is allowed to expand by allowing a dedicated drift portion. A beam expander may be the final element in the HEBT. The beam expander can be a device (magnetic octupole or the like), or can be a length of travel for the beam that allows it to expand on its own. Beam expansion due to additional travel may be preferred, as use of the scanner could render active expanding/shaping the beam downstream of the scanner, extremely difficult. In summary, the beam is transported from the Linac, to a beam analyzer, then to a beam scanner, and lastly undergoes beam expansion.

While the particular embodiment shown in FIG. 17 includes elements for shaping and controlling the path of the beam, these are not required by the present invention. Alternative embodiments in accordance with the present invention could employ a drift tube configuration, lacking such elements and allowing the shape of the beam to expand after it exits the accelerator. Rather than scanning the beam itself, alternative embodiments may change the location of the beam by physical translation of the target tile itself.

FIG. 17 shows the remaining components of the apparatus, including an end station 1759. In this end station 1759, tiles 1760 in the process of being scanned with the energetic ion beam, are supported in a vacuum in scanning stage 1762. The tiles 1760 are provided to the scanning stage through a robotic chamber 1764 and a load lock 1766.

The scanning stage 1762 may function to translate in one, two, or even three dimensions, the position of the workpieces or bulk materials receiving the particle beam. In accordance with certain embodiments, the scanning stage may be configured to move along a single axis only. In accordance with still other embodiments, the scanning stage may be configured to move along two axes. As shown in the particular embodiment of FIG. 17, physical translation of the target material by the scanning stage may be accompanied by scanning of the beam by the scanning device acting alone, or in combination with scanning accomplished by the beam filter. A scanning stage is not required by the present invention, and in certain embodiments the workpieces may be supported in a stationary manner while being exposed to the radiation.

The various components of the apparatus of FIGS. 17-17C are typically under the control of a host computer 1780 including a processor 1782 and a computer readable storage medium 1784. Specifically, the processor is configured to be in electronic communication with the different elements of the apparatus 1700, including the ion source, accelerator, LEBT, HEBT, and end station. The computer readable storage medium has stored thereon codes for instructing the operation of any of these various components. Examples of aspects of the process that may be controlled by instructions received from a processor include, but are not limited to, pressures within the various components such as end station and the HEBT, beam current, beam shape, scan patterns (either by scanning the beam utilizing a scanner and/or analyzing magnet, and/or moving the target utilizing translation with XY motored stages at substrate, i.e. painting), beam timing, the feeding of tiles into/out of the end station, operation of the beam cleaning apparatus (i.e. the analyzing magnet), and flows of gases and/or power applied to the ion source, etc.

Figure 18:
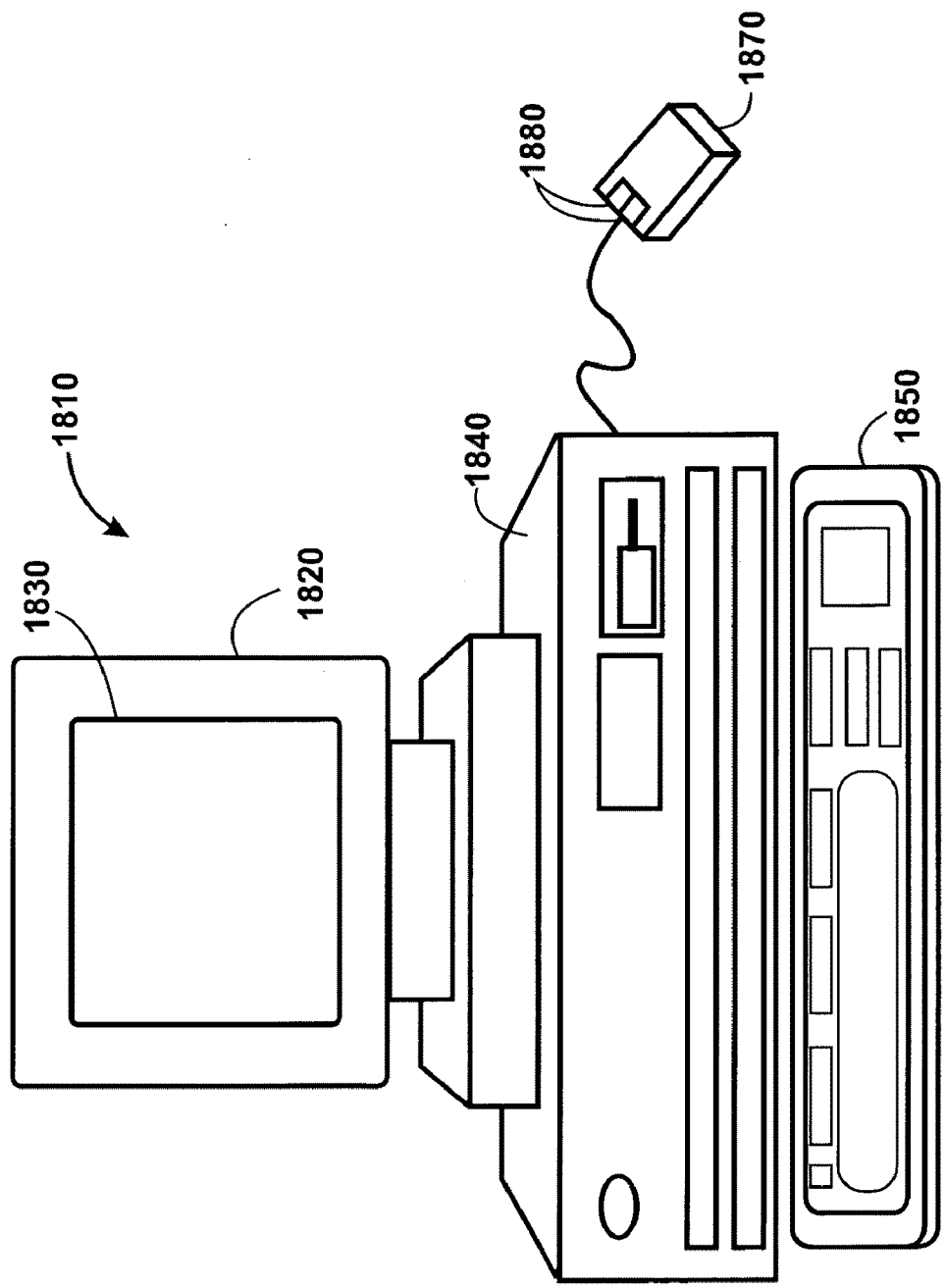
FIG. 18 is a schematic illustration of a computer system for use in accordance with embodiments of the present invention.

The various components of the coupon system described above may be implemented with a computer system having various features. FIG. 18 shows an example of a generic computer system 1810 including display device 1820, display screen 1830, cabinet 1840, keyboard 1850, and mouse 1870. Mouse 1870 and keyboard 1850 are representative "user input devices." Mouse 1870 includes buttons 1880 for selection of buttons on a graphical user interface device. Other examples of user input devices are a touch screen, light pen, track ball, data glove, microphone, and so forth. FIG. 18 is representative of but one type of system for embodying the present invention. It will be readily apparent to one of ordinary skill in the art that many system types and configurations are suitable for use in conjunction with the present invention. In a preferred embodiment, computer system 1810 includes a Pentium class based computer, running Windows NT operating system by Microsoft Corporation. However, the apparatus is easily adapted to other operating systems and architectures by those of ordinary skill in the art without departing from the scope of the present invention.

As noted, mouse 1870 can have one or more buttons such as buttons 1880. Cabinet 1840 houses familiar computer components such as disk drives, a processor, storage device, etc. Storage devices include, but are not limited to, disk drives, magnetic tape, solid state memory, bubble memory, etc. Cabinet 840 can include additional hardware such as input/output (I/O) interface cards for connecting computer system 1810 to external devices external storage, other computers or additional peripherals, further described below.

Figure 18A:
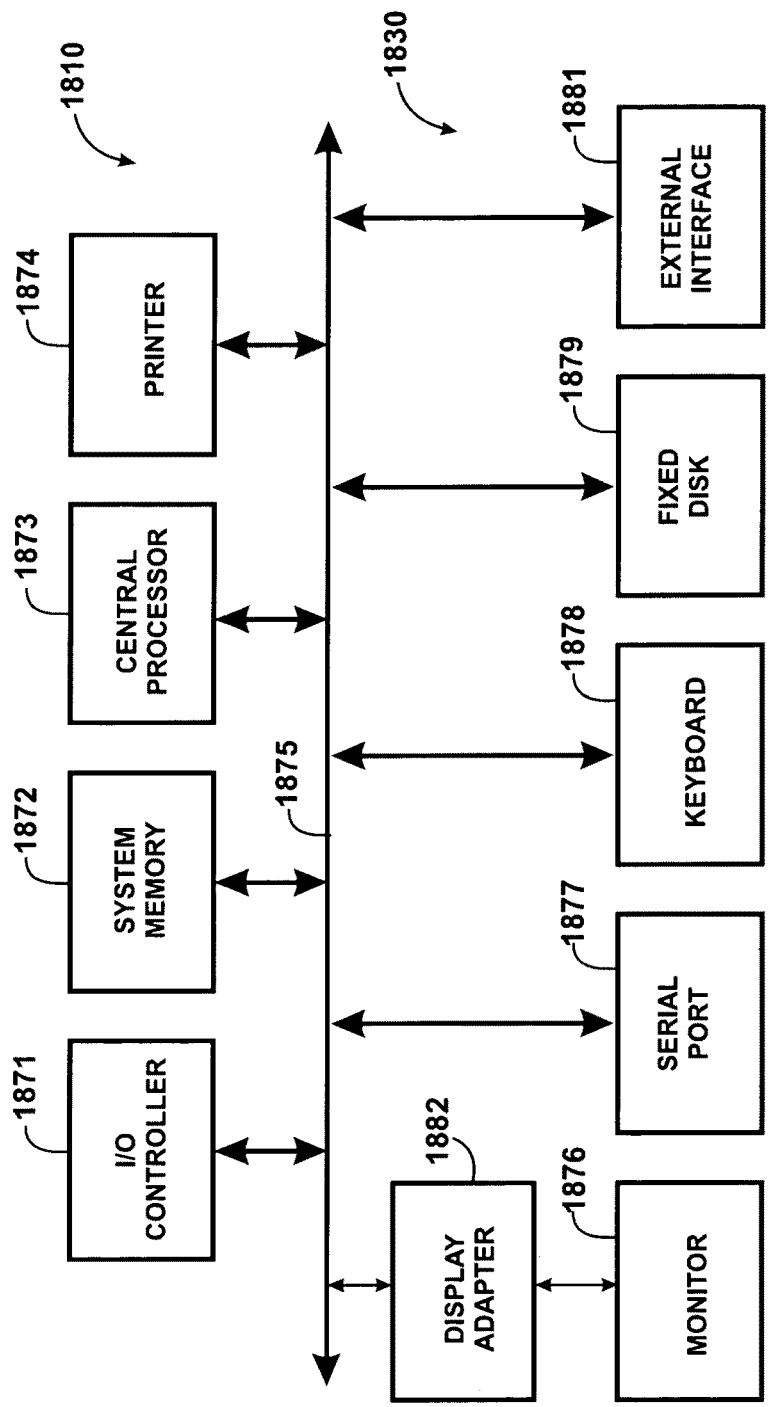
FIG. 18A is an illustration of basic subsystems the computer system of FIG. 18.

FIG. 18A is an illustration of basic subsystems in computer system 1810 of FIG. 18. This diagram is merely an illustration and should not limit the scope of the claims herein. One of ordinary skill in the art will recognize other variations, modifications, and alternatives. In certain embodiments, the subsystems are interconnected via a system bus 1875. Additional subsystems such as a printer 1874, keyboard 1878, fixed disk 1879, monitor 1876, which is coupled to display adapter 1882, and others are shown. Peripherals and input/output (I/O) devices, which couple to I/O controller 1871, can be connected to the computer system by any number of means known in the art, such as serial port 1877. For example, serial port 1877 can be used to connect the computer system to a modem 1881, which in turn connects to a wide area network such as the Internet, a mouse input device, or a scanner. The interconnection via system bus allows central processor 1873 to communicate with each subsystem and to control the execution of instructions from system memory 1872 or the fixed disk 1879, as well as the exchange of information between subsystems. Other arrangements of subsystems and interconnections are readily achievable by those of ordinary skill in the art. System memory, and the fixed disk are examples of tangible media for storage of computer programs, other types of tangible media include floppy disks, removable hard disks, optical storage media such as CD-ROMS and bar codes, and semiconductor memories such as flash memory, read-only-memories (ROM), and battery backed memory.

Any of the software components or functions described in this application, may be implemented as software code to be executed by a processor using any suitable computer language such as, for example, Java, C++ or Perl using, for example, conventional or object-oriented techniques. The software code may be stored as a series of instructions, or commands on a computer readable medium, such as a random access memory (RAM), a read only memory (ROM), a magnetic medium such as a hard-drive or a floppy disk, or an optical medium such as a CD-ROM. Any such computer readable medium may reside on or within a single computational apparatus, and may be present on or within different computational apparatuses within a system or network.

The implanted particles add stress or reduce fracture energy along a plane parallel to the top surface of the substrate at the selected depth. The energies depend, in part, upon the implantation species and conditions. These particles reduce a fracture energy level of the substrate at the selected depth. This allows for a controlled cleave along the implanted plane at the selected depth.

According to particular embodiments, implantation can occur under conditions such that the energy state of the substrate at all internal locations is insufficient to initiate a non-reversible fracture (i.e., separation or cleaving) in the substrate material. Alternatively, a patterned implant can be employed to introduce particles into only certain areas of the substrate, or to introduce lower doses in certain areas.

According to certain such embodiments, patterned implantation can be employed such that only regions in which cleaving is to be initiated, receive a full or high dose. Other regions where cleaving is merely to be propagated, may received reduced doses or no doses at all. Such variation in dosage may be accomplished either by controlling the dwell time of the beam in a particular region, by controlling the number of times a particular region is exposed to the beam, or by some combination of these two approaches. In one embodiment, a beam of 20 mA of H+ ions may provide a flux of $1.25 \times 10^{17}$ H atom/(cm$^2$ sec), with a minimum dwell time of 200 μs, resulting from a scan speed of 2.5 km/sec (corresponding to a scan frequency of 1.25 KHz within a 1 meter tray width using a 5 cm beam diameter), resulting in a per-pass minimum dose of $2.5 \times 10^{13}$ H atom/cm$^2$. Longer dwell times, of course, would increase the dosage received.

According to certain embodiments, cleaving action in high dose regions may be initiated by other forces, including but not limited to physical striking (blades), ultrasonics, or the stress resulting from the differences in coefficients of thermal expansion/contraction between different materials. In accordance with one particular embodiment, the substrate may be bonded to a metal layer, which as the substrate/metal combination cools, induces a stress sufficient to initiate cleaving in the regions receiving a high implant dosage, and/or propagate a pre-existing implant initiation region.

It should be noted, however, that implantation does generally cause a certain amount of defects (e.g., micro-detects) in the substrate that can typically at least partially be repaired by subsequent heat treatment, e.g., thermal annealing or rapid thermal annealing. Optionally, the method includes a thermal treatment process after the implanting process according to a specific embodiment. In a specific embodiment, the present method uses a thermal process ranging from about 450 to about 600 Degrees Celsius for silicon material. In a preferred embodiment, the thermal treatment can occur using conduction, convection, radiation, or any combination of these techniques. The high-energy particle beam may also provide part of the thermal energy and in combination with a external temperature source to achieve the desired implant temperature. In certain embodiment, the high-energy particle beam alone may provide the entire thermal energy desired for implant. Such secondary use of the high-energy beam as a heating source can help limit the energy expenditure of the system and increase overall system power efficiency. In a preferred embodiment, the treatment process occurs to season the cleave region for a subsequent cleave process. Of course, there can be other variations, modifications, and alternatives.

Figure 15:
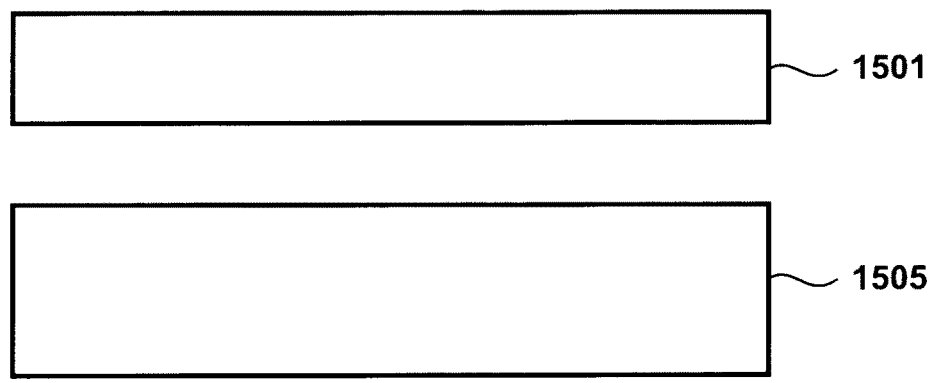
FIG. 15 is a simplified diagram illustrating a free-standing film formed by a cleave process from a semiconductor substrate according to an embodiment of the present invention.

In a specific embodiment, the method includes a step of freeing the thickness of detachable material, which is free standing, using a cleaving process, while the detachable material is free from an overlying support member or the like, as illustrated by FIG. 15. As shown, the detachable material 1501 is removed from the remaining substrate portion 1505. In a specific embodiment, the step of freeing can be performed using a controlled cleaving process. The controlled cleaving process provides a selected energy within a portion of the cleave region of the donor substrate. As merely an example, the controlled cleaving process has been described in U.S. Pat. No. 6,013,563 titled Controlled Cleaving Process, commonly assigned to Silicon Genesis Corporation of San Jose, Calif., and hereby incorporated by reference for all purposes. As shown, the method frees the thickness of material from the substrate to completely remove the thickness of material. Of course, there can be other variations, alternatives, and modifications.

Figure 16:
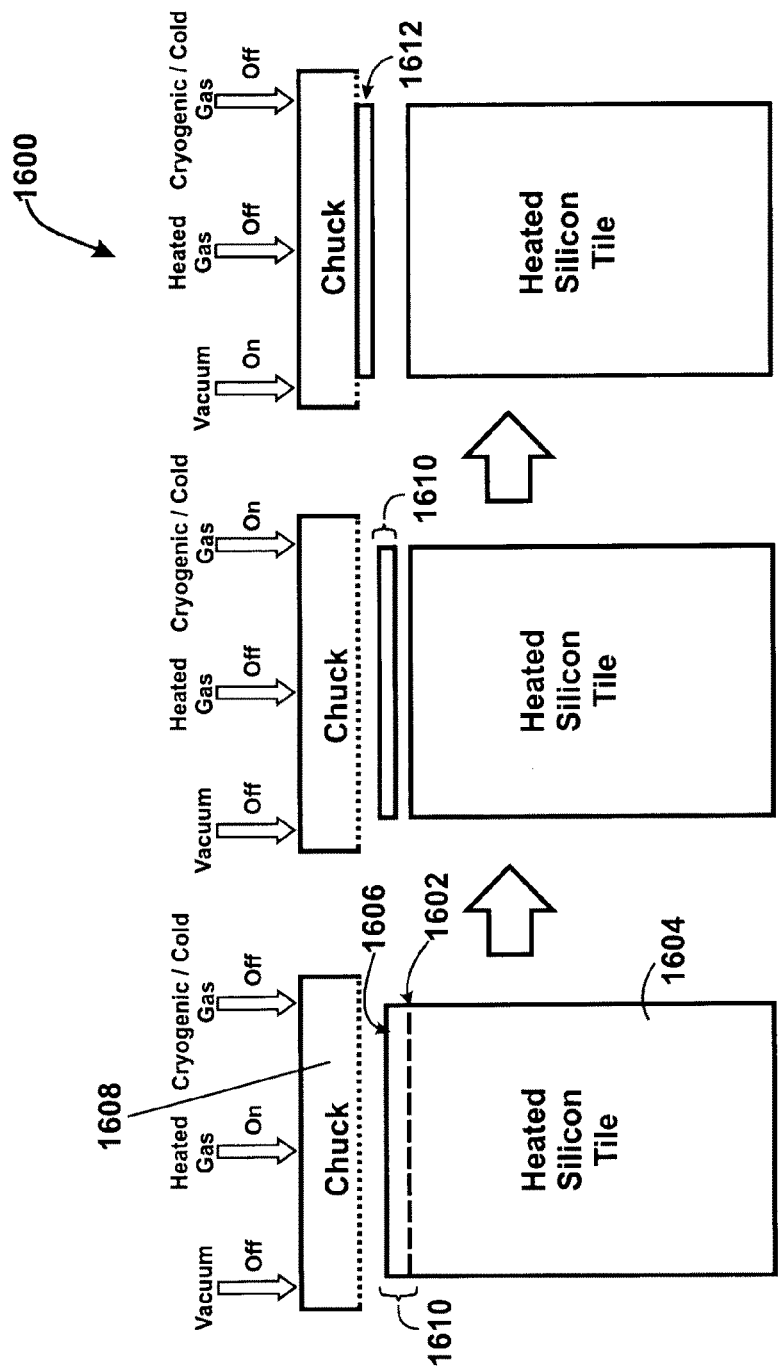
FIG. 16 is a simplified diagram illustrating a method of forming a detachable thick film from a semiconductor substrate according to an embodiment of the present invention.

FIG. 16 illustrates a method 1600 of freeing a thickness of detachable material 1610 according to an alternative embodiment of the present invention. As shown, a cleave plane 1602 is provided in a substrate 1604 having a surface region 1606. The substrate can be a silicon wafer or the like. The cleave plane can be provided using implanted hydrogen species described elsewhere in the present specification in a specific embodiment. Other implant species may also be used. These other implant species can include helium species or a combination. In a specific embodiment, the substrate is maintained at a pre-determined temperature range. As shown, a chuck member 1608 is provided. The chuck member includes means to provide a vacuum, a heated gas, and a cryogenic/cold gas. To detach the detachable material, the chuck member is coupled to the surface region of the substrate and the chuck member release a heated gas to increase the temperature of the substrate to another range. The substrate is cooled using the cryogenic/cold gas to cause detachment of the thickness of material from the substrate. The detached thickness of material may then be removed by applying a vacuum to the surface region 1612. Of course there can be other variations, modifications, and alternatives.

In a specific embodiment, the present method can perform other processes. For example, the method can place the thickness of detached material on a support member, which is later processed. Additionally or optionally, the method performs one or more processes on the semiconductor substrate before subjecting the surface region with the first plurality of high energy particles. Depending upon the embodiment, the processes can be for the formation of photovoltaic cells, integrated circuits, optical devices, any combination of these, and the like. Of course, there can be other variations, modifications, and alternatives.

While the above is a full description of the specific embodiments, various modifications, alternative constructions and equivalents may be used. Although the above has been described using a selected sequence of steps, any combination of any elements of steps described as well as others may be used. Additionally, certain steps may be combined and/or eliminated depending upon the embodiment. Furthermore, the particles of hydrogen can be replaced using co-implantation of helium and hydrogen ions or deuterium and hydrogen ions to allow for formation of the cleave plane with a modified dose and/or cleaving properties according to alternative embodiments. Still further, the particles can be introduced by a diffusion process rather than an implantation process. Of course there can be other variations, modifications, and alternatives. Therefore, the above description and illustrations should not be taken as limiting the scope of the present invention which is defined by the appended claims.

What is claimed is:

1. A method for fabricating a free standing thickness of materials using one or more semiconductor substrates, comprising:
providing a semiconductor substrate having a surface region and a thickness;
subjecting the surface region of the semiconductor substrate to a first plurality of energetic particles generated using a linear accelerator to form a region of a plurality of gettering sites within a cleave region, the cleave region being provided beneath the surface region to define a thickness of material to be detached, the semiconductor substrate being maintained at a first temperature;
subjecting the semiconductor substrate to a treatment process;
subjecting the surface region of the semiconductor substrate to a second plurality of energetic particles generated using the linear accelerator, the second plurality of energetic particles being provided to increase a stress level of the cleave region from a first stress level to a second stress level, the semiconductor substrate being maintained at a second temperature,
wherein the second temperature is higher than the first temperature and greater than 350 Degrees Celsius; and
freeing the thickness of material to be detached using a cleaving process, wherein a surface of the material to be detached that faces away from a remaining portion of the semiconductor substrate is not bonded to a support member during the cleaving process.

2. The method of claim 1 wherein the semiconductor substrate comprises monocrystalline silicon or polycrystalline silicon.

3. The method of claim 2 wherein the hydrogen species are provided at a dose of between about $1 \times 10^{15}$ and $2 \times 10^{16}$ atoms per $cm^2$.

4. The method of claim 1 wherein the first plurality of energetic particles or the second plurality of energetic particles comprise hydrogen species or helium species.

5. The method of claim 1 wherein the linear accelerator comprises a radio frequency quadrupole (RFQ).

6. The method of claim 1 wherein the first plurality of energetic particles are provided in an energy ranging from 0.5 MeV to 12 MeV.

7. The method of claim 1 wherein the treatment process is a thermal process provided at a temperature of 400 Degree Celsius or higher to render the microscopic defect region to be close to the cleave region and stabilize the microscopic defect region.

8. The method of claim 1 wherein the first temperature is less than about 250 Degrees Celsius.

9. The method of claim 1 wherein the thickness of material to be detached has a thickness of between about 50-100 microns.

10. The method of claim 1 wherein the first plurality of energetic particles and the second plurality of energetic particles are provided from the linear accelerator in an expanded beam having a dimension of about 500 mm in diameter on the surface region of the semiconductor substrate.

11. The method of claim 1 wherein the treatment process comprises:
subjecting the surface region to high energy particle beams to provide thermal treatment.

12. The method of claim 1 wherein subjecting the surface region to the first plurality of energetic particles comprises a patterned implant dose profile.

13. The method of claim 1 wherein subjecting the surface region to the second plurality of energetic particles comprises a patterned implant dose profile.

14. A method for forming a free standing thickness of layer transferred material, the method comprising:
providing a crystalline substrate material having a surface region;
introducing a plurality of first particles at a first dose range and within a first temperature range, whereupon the first dose range being less than an amount sufficient to cause the plurality of first particles to be permanently disposed in the crystalline substrate material at an accumulation region, through the surface region to the accumulation region of the crystalline substrate material to form an implant profile having a peak concentration and a base to form the accumulation region, the plurality of first particles causing a plurality of defects in the crystalline substrate material in the accumulation region, the accumulation region being defined by a depth greater than about 20 microns beneath the surface region and a slice of crystalline material to be detached between the accumulation region and the surface region;

performing a treatment process on the crystalline substrate material to cause formation of a plurality of substantially permanent defects that have been quenched in the crystalline substrate material from the first particles in the accumulation region; and introducing a plurality of second particles at a second dose range and a second temperature range into the accumulation region to increase an internal stress in the accumulation region to cause a portion of the accumulation region to be cleavable, wherein the second temperature range is higher than the first temperature range and does not include a temperature that is less than or equal to 350 Degrees Celsius;

forming a free standing thickness of crystalline material by detaching a thickness of crystalline material from a remaining portion of the crystalline substrate material, wherein a surface of the free standing thickness of crystalline material that faces away form a remaining portion of the crystalline substrate is free from a support member during the detaching.

15. The method of claim 14 wherein the crystalline substrate material is a single crystal silicon or polycrystalline silicon.

16. The method of claim 14 wherein the first dose range is from about $2\times10^{15}$ to $2\times10^{16}$ ions per cm$^2$.

17. The method of claim 14 wherein the plurality of first particles are introduced while the crystalline substrate material is maintained at a temperature ranging from about −50 to +250 Degrees Celsius.

18. The method of claim 14 wherein the first plurality of particles comprises of hydrogen.

19. The method of claim 14 wherein the base has a width of about 2 Rp or less, where Rp is a depth variation of an implant concentration profile.

20. A method for forming a free standing layer of semiconductor material, the method comprising:
providing a bulk semiconductor material having a surface;
implanting through the surface and into the bulk material, a first plurality of particles output by a linear accelerator at an energy of between about 0.5-12 MeV, to form a cleave region comprising a plurality of gettering sites, a distance between the cleave region and the surface defining a thickness of a semiconductor material to be detached, the bulk semiconductor material being maintained at a first temperature;

introducing a second plurality of a high energy particles into the cleave region, the bulk semiconductor material being maintained at a second temperature that is higher than the first temperature and greater than 350 Degrees Celsius; and freeing the thickness of semiconductor material to be detached using a controlled cleaving process, a surface of the thickness of semiconductor material to be detached that faces away from a remaining portion of the semiconductor substrate being free from a support member during the controlled cleaving.

21. The method of claim 20 wherein:
the implanting is performed in a pattern to create the cleave region locally; and
the controlled cleaving is initiated at the cleave region and then propagated across the bulk material.

22. The method of claim 21 wherein the implanting is performed by controlling a dwell time of a beam of the first plurality of particles.

23. The method of claim 21 wherein the implanting is performed by controlling a number of exposures of the cleave region to a beam of the first plurality of particles.

24. The method of claim 21 wherein the controlled cleaving action is initiated by application of physical stress to the substrate.

25. The method of claim 24 wherein the physical stress is applied to the substrate by changing a thermal state of the substrate, by striking the substrate, or by changing a shape of an element to which the substrate is bound.

* * * * *